(12) United States Patent
Yaguchi et al.

(10) Patent No.: US 8,835,847 B2
(45) Date of Patent: Sep. 16, 2014

(54) SAMPLE HOLDING APPARATUS FOR ELECTRON MICROSCOPE, AND ELECTRON MICROSCOPE APPARATUS

(75) Inventors: Toshie Yaguchi, Tokyo (JP); Akira Watabe, Tokyo (JP); Yusuke Ominami, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/114,164

(22) PCT Filed: Apr. 20, 2012

(86) PCT No.: PCT/JP2012/060663
§ 371 (c)(1),
(2), (4) Date: Oct. 25, 2013

(87) PCT Pub. No.: WO2012/147632
PCT Pub. Date: Nov. 1, 2012

(65) Prior Publication Data
US 2014/0042318 A1    Feb. 13, 2014

(30) Foreign Application Priority Data

Apr. 28, 2011 (JP) ................. 2011-100950

(51) Int. Cl.
*G01N 23/00* (2006.01)
*G21K 7/00* (2006.01)
*H01J 37/20* (2006.01)
*H01J 37/26* (2006.01)

(52) U.S. Cl.
CPC .......... *H01J 37/20* (2013.01); *H01J 37/26* (2013.01); *H01J 2237/2065* (2013.01); *H01J 2237/006* (2013.01); *H01J 2237/2003* (2013.01)
USPC .......................................... 250/311

(58) Field of Classification Search
USPC ........................................... 250/311
See application file for complete search history.

(56) References Cited

U.S. PATENT DOCUMENTS 4,071,766 A * 1/1978 Kalman et al. ............. 250/443.1
5,406,087 A * 4/1995 Fujiyoshi et al. ........ 250/440.11
(Continued)

FOREIGN PATENT DOCUMENTS

| JP | 09-129168 | 5/1997 |
| JP | 2008-512841 A | 4/2008 |
| JP | 2009-117196 A | 5/2009 |

OTHER PUBLICATIONS

International Search Report, w/ English translation thereof, issued in International Patent Application No. PCT/JP2012/060663 dated May 22, 2012.

*Primary Examiner* — Michael Logie
*Assistant Examiner* — Sean Luck
(74) *Attorney, Agent, or Firm* — McDermott Will & Emery LLP

(57) ABSTRACT

A sample holding apparatus for electron microscope includes: a sample holding assembly including an assembly of three components of an upper diaphragm holding part, a sample holding plate and a lower diaphragm holding part; and a holding part that holds the sample holding assembly replaceably. The sample holding assembly includes a cell defined between a diaphragm of the upper diaphragm holding part and a diaphragm of the lower diaphragm holding part, and a flow channel connected to the cell, in which a sample mounted at a protrusion of the sample holding plate is placed. The diaphragm of the upper diaphragm holding part, the sample and the diaphragm of the lower diaphragm holding part are disposed along an optical axis of an electron beam.

20 Claims, 23 Drawing Sheets

(56) References Cited

U.S. PATENT DOCUMENTS

| | | | |
|---|---|---|---|
| 6,469,309 B1* | 10/2002 | Kasai | 250/442.11 |
| 6,989,542 B2* | 1/2006 | Moses et al. | 250/440.11 |
| 7,388,211 B2* | 6/2008 | Chao et al. | 250/441.11 |
| 7,518,720 B2* | 4/2009 | Kolp et al. | 356/246 |
| 7,554,099 B2* | 6/2009 | Chao et al. | 250/440.11 |
| 8,059,271 B2* | 11/2011 | Marsh et al. | 356/246 |
| 2007/0145289 A1* | 6/2007 | Chao et al. | 250/440.11 |
| 2008/0073521 A1* | 3/2008 | Yaguchi et al. | 250/306 |
| 2008/0093565 A1* | 4/2008 | Yaguchi et al. | 250/440.11 |
| 2008/0179518 A1 | 7/2008 | Creemer et al. | |
| 2011/0079710 A1* | 4/2011 | Damiano et al. | 250/307 |
| 2011/0303845 A1* | 12/2011 | Yaguchi et al. | 250/310 |

* cited by examiner

SAMPLE HOLDING APPARATUS FOR ELECTRON MICROSCOPE, AND ELECTRON MICROSCOPE APPARATUS

RELATED APPLICATIONS

This application is the U.S. National Phase under 35 U.S.C. §371 of International Application No. PCT/JP2012/060663, filed on Apr. 20, 2012, which in turn claims the benefit of Japanese Application No. 2011-100950, filed on Apr. 28, 2011, the disclosures of which Applications are incorporated by reference herein.

TECHNICAL FIELD

The present invention relates to an electron microscope apparatus, and particularly relates to a sample holding apparatus for the electron microscope to hold a sample.

BACKGROUND ART

Transmission electron microscopes (TEM) and scanning transmission electron microscopes (STEMs) are configured for observation of a sample in vacuum atmosphere. Recently there is a growing need for analysis of the structure or characteristics of a substance or for in situ observation of a synthetic process of a substance in special atmosphere such as gas or liquid. To this end, observation of a sample in special atmosphere with an electron microscope is required.

Patent Literatures 1 and 2 describe a sample holder for observation of a sample in gas atmosphere with an electron microscope. This sample holder has a mechanism that holds a sample between two grids, introduces gas therebetween and then exhausts the gas. This sample holder, however, is not configured for observation the sample at a specific site thereof as well as prevention of contamination of a diaphragm by irradiation with electron beams.

Patent Literature 3 describes a microreactor for observation of a sample in specific atmosphere with an electron microscope. This microreactor is configured to supply gas or liquid to a chamber formed between two cover layers that are partially transparent. The microreactor further is equipped with a mechanism that heats the cover layers as well as fluid or a sample in the chamber. A heating element is placed in or on the cover layer, and the sample is placed on the heating element.

CITATION LIST

Patent Literatures

Patent Literature 1: JP 2009-117196 A
Patent Literature 2: JP 9-129168 A
Patent Literature 3: JP 2008-512841 A (WO PCT/NL2005/000662)

SUMMARY OF INVENTION

Technical Problem

The sample holders described in Patent Literatures 1 and 2 are not configured for observation of a sample in special atmosphere at a specific site of the sample.

The microreactor described in Patent Literature 3 is configured to place a sample directly at a cover layer that is for separation between vacuum and special atmosphere in a sample chamber of an electron microscope, and so has a problem that the cover layer and the sample have to be changed after each observation.

Then it is an object of the present invention to provide a sample holding apparatus for electron microscope and an electron microscope facilitating observation of a specific site of a sample in special atmosphere such as gas or liquid with a microscope and eliminating the necessity of the work such as replacement of a diaphragm for each observation.

Solution to Problem

A sample holding apparatus for electron microscope according to the present invention includes: a sample holding assembly including an assembly of three components of an upper diaphragm holding part, a sample holding plate and a lower diaphragm holding part; and a holding part that holds the sample holding assembly replaceably.

The sample holding assembly includes a cell defined between a diaphragm of the upper diaphragm holding part and a diaphragm of the lower diaphragm holding part, and a flow channel connected to the cell in which a sample mounted at a protrusion of the sample holding plate is placed. The diaphragm of the upper diaphragm holding part, the sample and the diaphragm of the lower diaphragm holding part are disposed along an optical axis of an electron beam.

Advantageous Effects of Invention

The present invention can provide a sample holding apparatus for electron microscope and an electron microscope facilitating observation of a specific site of a sample in special atmosphere such as gas or liquid with a microscope and eliminating the necessity of the work such as replacement of a diaphragm for each observation.

DESCRIPTION OF EMBODIMENTS

Figure 1:
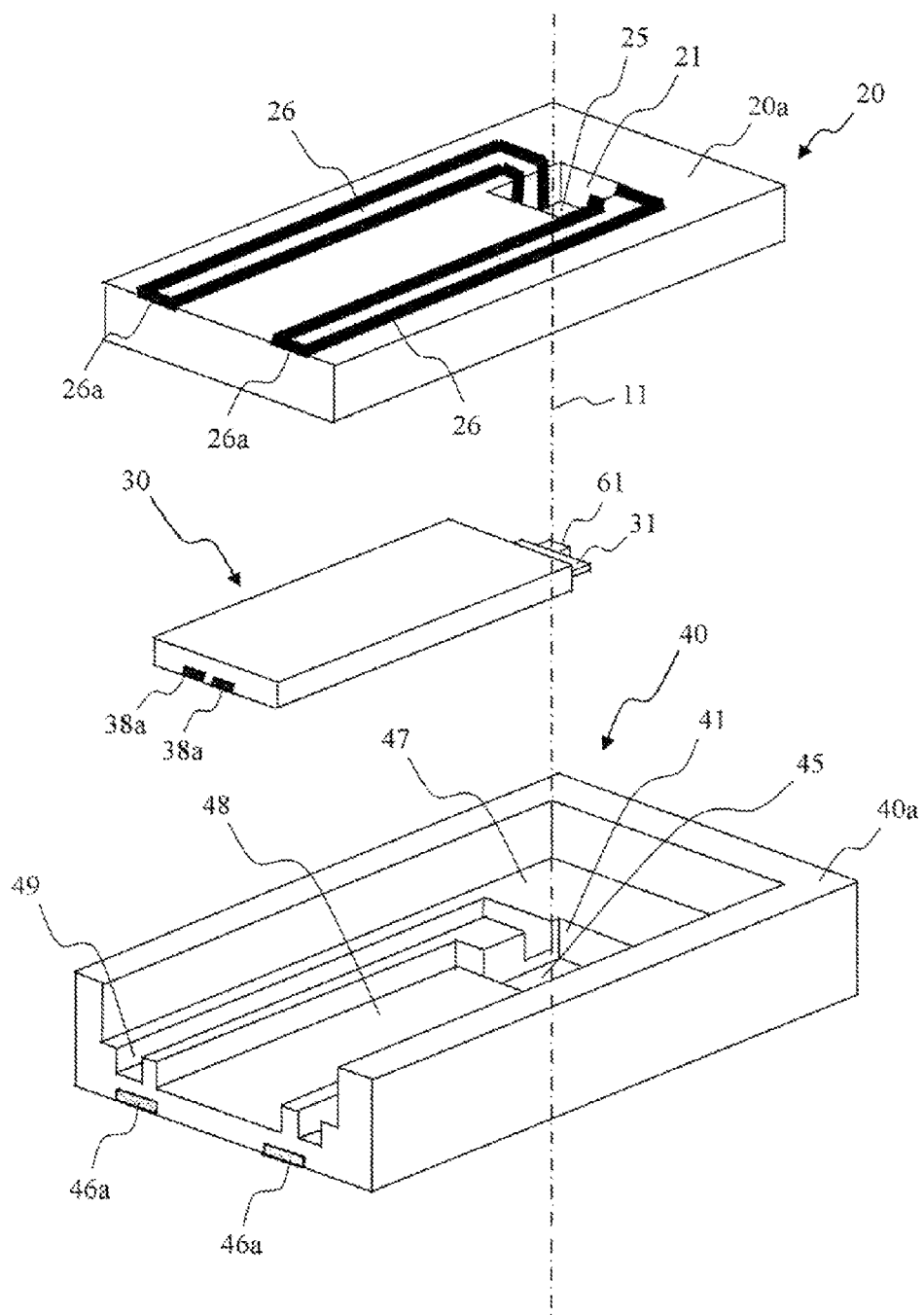
FIG. 1 is an exploded perspective view of an exemplary sample holding assembly of a sample holding apparatus for electron microscope according to the present invention.

FIG. 1 illustrates a basic configuration of a sample holding assembly of a sample holder for electron microscope that is one embodiment of the present invention. The sample holding assembly of the present embodiment includes three components of a rectangular upper diaphragm holding part 20, a rectangular sample holding plate 30 and a rectangular lower diaphragm holding part 40. In the drawing, the dot-and-dash line indicates an optical axis 11 of an electron beam.

The upper diaphragm holding part 20 has an upper face 20a, in which a square recess 21 is formed, and at a bottom face of the recess 21, a diaphragm 25 is placed. The recess 21 is defined by a through hole extending from the upper face to a lower face of the upper diaphragm holding part 20 and the diaphragm 25 that blocks an opening of the through hole. The sample holding plate 30 has one end provided with a protrusion 31, to which a sample 61 to be observed with an electron microscope is attached. The sample holding plate 30 has a lower face provided with electrodes 38 (FIG. 4C). The sample holding plate 30 has an end face having terminals 38a mounted thereto, to which the electrodes 38 are connected (FIG. 4C).

The lower diaphragm holding part 40 has an upper face 40a, in which a recess 47 having a shape corresponding to the outer shape of the upper diaphragm holding part 20 is formed. This recess 47 has a bottom face, in which a rectangular recess 48 having a shape corresponding to the outer shape of the sample holding plate 30, two grooves 49 extending along the outer periphery of the recess 48 and a square recess 41 adjacent to the rectangular recess 48 are formed. At a bottom face of the recess 41, a diaphragm 45 is placed. The recess 41 is defined by a through hole formed at the bottom face of the recess 48 and the diaphragm 45 that blocks an opening of the through hole. The two grooves 49 extend from an end face of the lower diaphragm holding part 40 and along both sides of the rectangular recess 48 to be connected to the square recess 41.

These three components of the upper diaphragm holding part 20, the sample holding plate 30 and the lower diaphragm holding part 40 are assembled, whereby a sample holding assembly is formed. That is, the sample holding plate 30 is engaged in the recess 48 of the lower diaphragm holding part 40, and then the upper diaphragm holding part 20 is engaged in the recess 47 of the lower diaphragm holding part 40 so as to cover the sample holding plate 30. Thereby, the sample holding assembly is formed. The sample holding assembly has a space (cell) between the diaphragm 25 of the upper diaphragm holding part 20 and the diaphragm 45 of the lower diaphragm holding part 40. In this cell, the sample 61 attached to the protrusion 31 of the sample holding plate 30 is disposed. The two diaphragms 25 and 45 and the sample 61 are arranged along the optical axis 11 of the electron beam.

The two grooves 49 of the lower diaphragm holding part 40 and the lower face of the upper diaphragm holding part 20 define a flow channel. This flow channel extends from an end face of the sample holding assembly to the cell. Liquid or gas supplied to this flow channel forms atmosphere of the liquid or the gas around the sample 61 disposed in the cell.

The mating faces for assembly of the upper diaphragm holding part 20, the sample holding plate 30 and the lower diaphragm holding part 40 are mirror faces. For instance, the lower face of the upper diaphragm holding part 20, the upper face and the lower face of the sample holding plate 30, the upper face 40a of the lower diaphragm holding part 40, the bottom face of the recess 47 and the bottom face of the recess 48 are mirror finished.

In the present example, at least one of the upper diaphragm holding part 20, the sample holding plate 30 and the lower diaphragm holding part 40 is provided with a heater. For instance, the upper face 20a of the upper diaphragm holding part 20 is provided with a heater 26. The upper diaphragm holding part 20 has an end face, to which terminals 26a of the heater 26 are mounted. The lower face of the lower diaphragm holding part 40 is provided with a heater 46 (FIG. 3C). Then, the end face of the lower diaphragm holding part 40 has terminals 46a for the heater 46 mounted thereto. These heaters 26 and 46 are disposed at positions corresponding to the two grooves 49 of the lower diaphragm holding part 40. The heater 26 extends to the diaphragm 25, and the heater 46 extends to the vicinity of the diaphragm 45. These heaters 26 and 46 heat liquid or gas flowing through the flow channel and the cell as well as the diaphragms 25 and 45. Heating of the diaphragms 25 and 45 prevents contamination of the diaphragms 25 and 45 resulting from irradiation with an electron beam.

The diaphragms 25 and 45 are made of a light element that allows an element beam to pass therethrough. Known light elements include carbon, silicon, silicon oxide, silicon nitride and the like. The diaphragms 25 and 45 may be made of a material of these light elements or amorphous of them. The diaphragms 25 and 45 may have a thickness of 10 to 20 nm, for example. The diaphragms 25 and 45 may have a square shape having the dimension of one side that is 250 to 500 μm.

The sample holding plate 30 may have a dimension in the longitudinal direction of 4 to 5 mm, for example, a dimension in the width direction of 2 to 3 mm, for example, and a thickness of 200 to 500 μm, for example. The protrusion 31 of the sample holding plate 30 may have a thickness of 50 μm or less at a part mounting a sample thereon, which may be 50 to 10 μm or further may be 50 to 5 μm.

The upper diaphragm holding part 20, the sample holding plate 30 and the lower diaphragm holding part 40 may be manufactured by a photolithography technique used in semiconductor manufacturing process. The upper diaphragm holding part 20, the sample holding plate 30 and the lower diaphragm holding part 40 may be made of silicon. The sample holding plate 30 may be made of silicon, or may be made of ceramic or a predetermined material coated with ceramic.

Figure 2A:
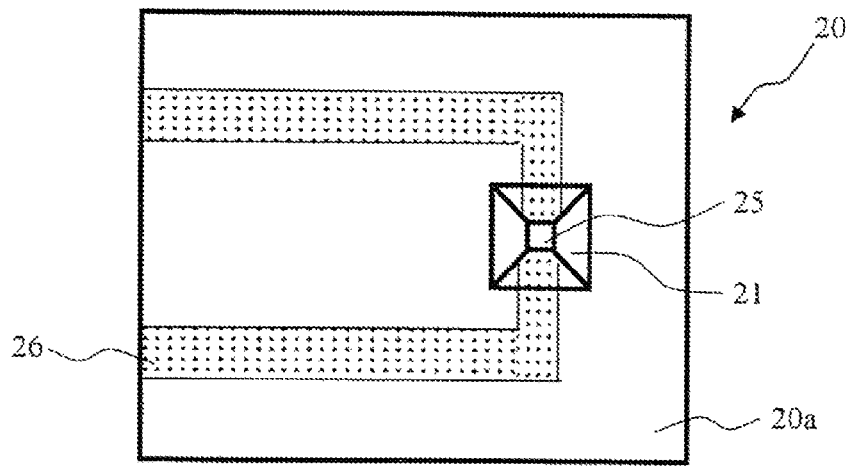
FIG. 2A is a top view of an exemplary upper diaphragm holding part of the sample holding assembly of the sample holding apparatus for electron microscope according to the present invention.
Figure 2B:
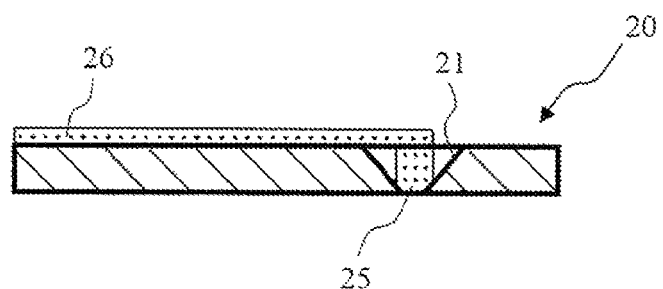
FIG. 2B is a cross-sectional view of the exemplary upper diaphragm holding part of the sample holding assembly of the sample holding apparatus for electron microscope according to the present invention.
Figure 2C:
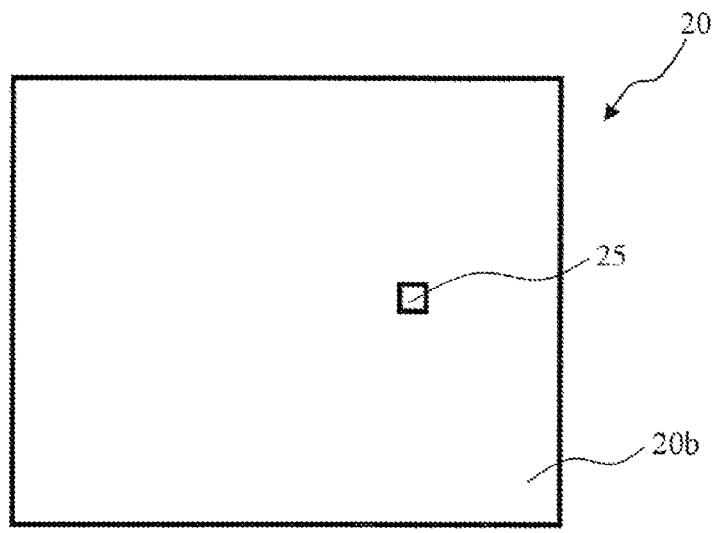
FIG. 2C is a bottom view of the exemplary upper diaphragm holding part of the sample holding assembly of the sample holding apparatus for electron microscope according to the present invention.

FIGS. 2A, 2B and 2C are a top view, a cross-sectional view and a bottom view, respectively, of the upper diaphragm holding part 20 of the sample holding assembly of the sample holding apparatus for electron microscope. The upper face 20a of the upper diaphragm holding part 20 includes the square recess 21, at the bottom face of which the diaphragm 25 is provided. The dimension of the square opening of the recess 21 is larger than the square bottom face of the recess 21. The space inside the recess 21 has a truncated square pyramid shape. This means that the inner walls of the recess 21 have a trapezoidal tapered face. Such a recess 21 having dimensions where the dimension of the opening is larger than the dimension of the bottom face allows an electron beam to enter the diaphragm 25 without being disturbed by the edges of the opening of the recess 21.

To form the recess 21, a through hole from the upper face 20*a* to the lower face 20*b* of the upper diaphragm holding part 20 is firstly formed. Next, the diaphragm 25 is mounted so as to block the opening of the through hole at the lower face 20*b* of the upper diaphragm holding part 20. Alternatively, after forming the diaphragm 25 at the lower face 20*b* of the upper diaphragm holding part 20, a through hole may be formed from the upper face 20*a* to the lower face 20*b* so as to leave the diaphragm 25.

The upper face 20*a* of the upper diaphragm holding part 20 is provided with the heater 26. The heater 26 includes two strips extending along the longitudinal direction of the upper diaphragm holding part 20 and then bending toward the recess 21. The heater 26 extends to the diaphragm 25 via inclining faces of the recess 21. In the present example, the heater 26 is provided at the upper face 20*a* of the upper diaphragm holding part 20, which may be embedded in the upper diaphragm holding part 20.

Figure 3A:
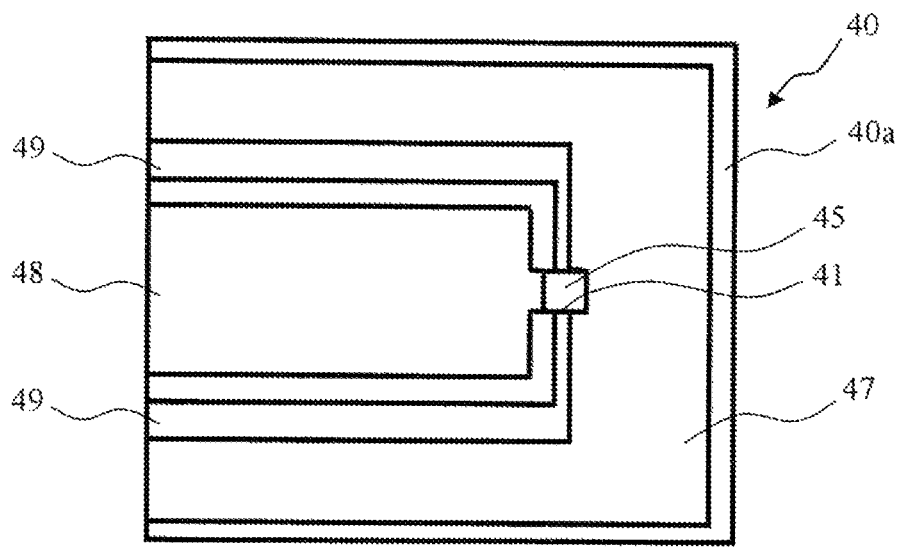
FIG. 3A is a top view of an exemplary lower diaphragm holding part of the sample holding assembly of the sample holding apparatus for electron microscope according to the present invention.
Figure 3B:
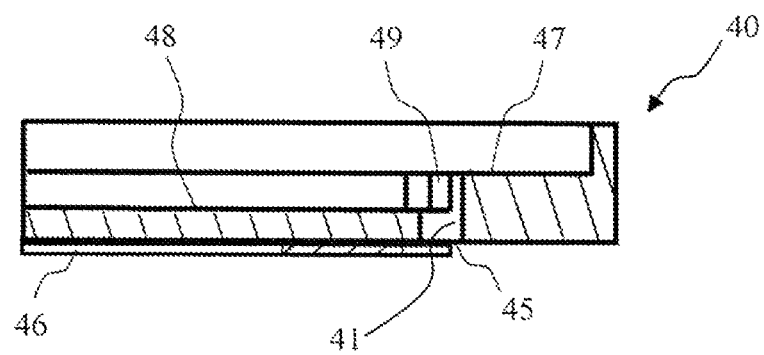
FIG. 3B is a cross-sectional view of the exemplary lower diaphragm holding part of the sample holding assembly of the sample holding apparatus for electron microscope according to the present invention.
Figure 3C:
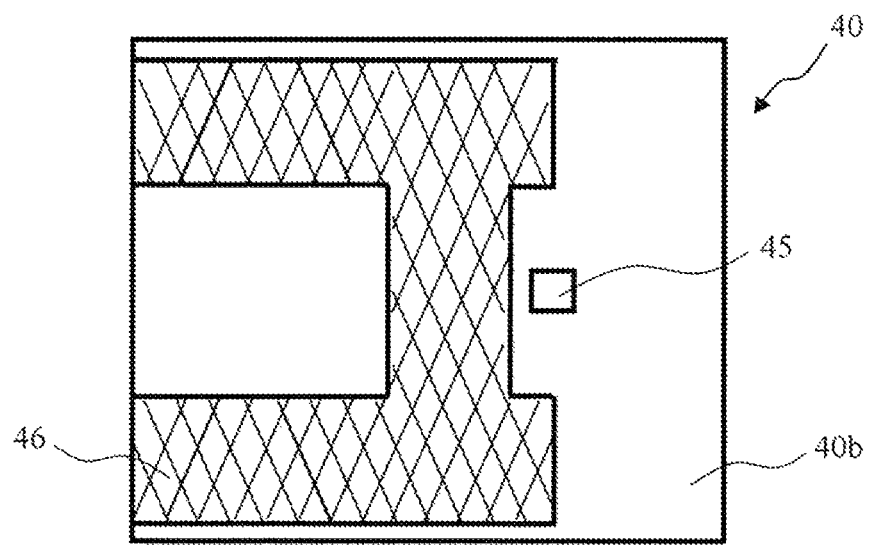
FIG. 3C is a bottom view of the exemplary lower diaphragm holding part of the sample holding assembly of the sample holding apparatus for electron microscope according to the present invention.

FIGS. 3A, 3B and 3C are a top view, a cross-sectional view and a bottom view, respectively, of the lower diaphragm holding part 40 of the sample holding assembly of the sample holding apparatus for electron microscope. The upper face 40*a* of the lower diaphragm holding part 40 includes the rectangular recess 47. The bottom face of the recess 47 includes the rectangular recess 48 and the grooves 49. The bottom face of the recess 47 further includes the square recess 41, at the bottom face of which the diaphragm 45 is provided. The grooves 49 extend from the end face of the lower diaphragm holding part 40 to the recess 41.

To form the recess 41, a through hole is firstly formed at the bottom face of the recess 47 of the lower diaphragm holding part 40. Next, the diaphragm 45 is mounted so as to block the opening of the through hole at the lower face 40*b* of the lower diaphragm holding part 40. Alternatively, after forming the diaphragm 45 at the lower face 40*b* of the lower diaphragm holding part 40, a through hole may be formed from the upper face 40*a* to the lower face 40*b* so as to leave the diaphragm 45.

The lower face 40*b* of the lower diaphragm holding part 40 is provided with the heater 46. The heater 46 is disposed at a position corresponding to the two grooves 49. The heater 46 is disposed so as to surround the diaphragm 45. The heater 46 may be disposed so as to extend to the diaphragm 45.

Figure 4A:
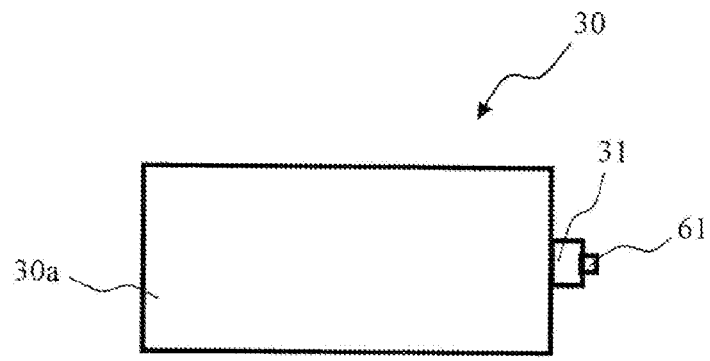
FIG. 4A is a top view of a first exemplary sample holding plate of the sample holding assembly of the sample holding apparatus for electron microscope according to the present invention.
Figure 4B:
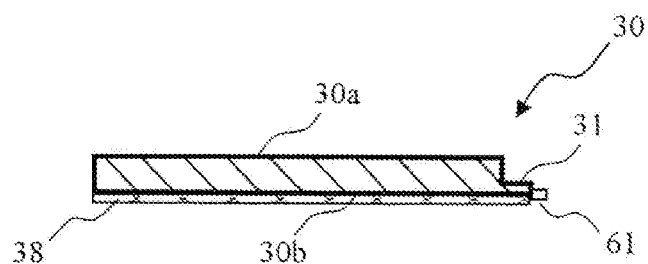
FIG. 4B is a cross-sectional view of the first exemplary sample holding plate of the sample holding assembly of the sample holding apparatus for electron microscope according to the present invention.
Figure 4C:
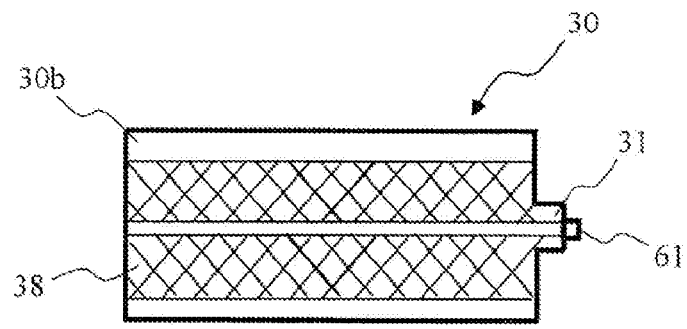
FIG. 4C is a bottom view of the first exemplary sample holding plate of the sample holding assembly of the sample holding apparatus for electron microscope according to the present invention.

FIGS. 4A, 4B and 4C are a top view, a cross-sectional view and a bottom view, respectively, of the sample holding plate 30 of the sample holding assembly of the sample holding apparatus for electron microscope. The sample holding plate 30 is provided with the protrusion 31 at its one end, and at a leading end of the protrusion 31, the sample 61 to be observed with an electron microscope is attached. The protrusion 31 extends along the lower face 30*b* of the sample holding plate 30, and has a thin plate-like shape. The lower face of the protrusion 31 is coplanar with the lower face 30*b* of the sample holding plate 30, and the upper face of the protrusion 31 has a step from the upper face 30*a* of the sample holding plate 30.

The lower face 30*b* of the sample holding plate 30 has two electrodes 38 thereon. The electrodes 38 are disposed along the lower face 30*b* of the sample holding plate 30 and further extends to the lower face of the protrusion 31. The electrodes 38 are then connected to the sample 61. A predetermined voltage can be applied to the sample 61 via the electrodes 38. According to the present example, the sample 61 can be observed with an electron microscope while a predetermined voltage is applied to the sample.

Figure 13A:
FIG. 13A is a top view of another exemplary sample holding plate of the sample holding assembly of the sample holding apparatus for electron microscope according to the present invention.
Figure 13B:
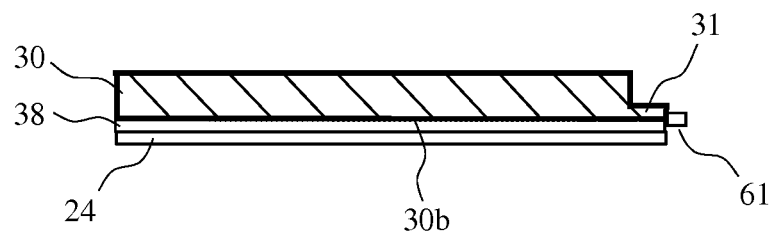
FIG. 13B is a cross-sectional view of the other exemplary sample holding plate of the sample holding assembly of the sample holding apparatus for electron microscope according to the present invention.
Figure 13C:
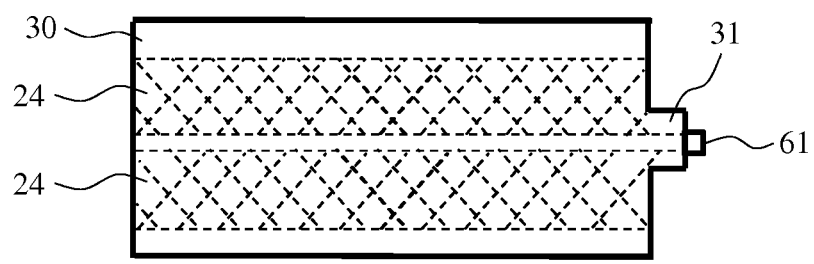
FIG. 13C is a bottom view of the other exemplary sample holding plate of the sample holding assembly of the sample holding apparatus for electron microscope according to the present invention.

FIGS. 13A, 13B and 13C are a top view, a cross-sectional view and a bottom view, respectively, of another sample holding plate 30 of the sample holding assembly of the sample holding apparatus for electron microscope. In the drawings, like reference numerals designate like parts described in the above example to omit their duplicated description.

In the example of FIG. 4B, the electrodes 38 are exposed at the lower face of the sample holding plate 30. On the other hand, in the example of FIGS. 13A, 13B and 13C, electrodes 38 are covered with an insulating film 24. Specifically, the electrodes 38 are covered with the insulating film 24 at a part other than a connecting part with the sample 61 and a contacting part with wiring connected to a power supply for voltage application. The electrodes 38 may be embedded in a base material of the sample holding plate 30 at a part other than the connecting part with the sample 61 and the contacting part with the wiring. This can prevent electrical continuity occurring between the electrodes due to liquid or the like.

Figure 5:
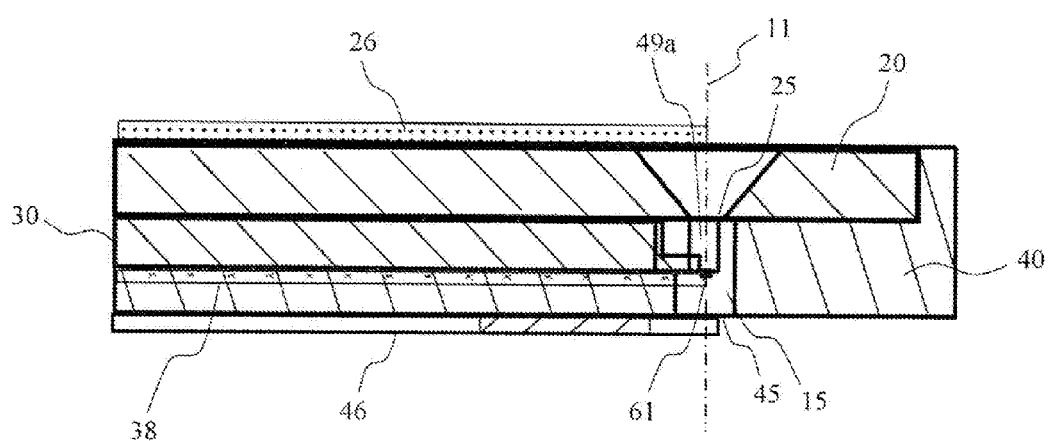
FIG. 5 is a cross-sectional view of an exemplary sample holding assembly of the sample holding apparatus for electron microscope according to the present invention.

FIG. 5 is a cross-sectional view of a sample holding assembly in the assembled state of the sample holding apparatus for electron microscope according to the present invention. The sample holding assembly is made up of the upper diaphragm holding part 20, the sample holding plate 30 and the lower diaphragm holding part 40, and three end faces of them make up a common end face of the sample holding assembly. Between the two diaphragms 25 and 45, a cell 15 is formed, and at a center of the cell 15, the sample 61 is disposed. The diaphragm 25, the sample 61 and the diaphragm 45 are disposed along the optical axis 11 of the electron beam. To the cell 15, gas or liquid is introduced via a flow channel 49*a*. Thereby, voltage can be applied to the sample 61 in any atmosphere. Gas or liquid in the cell 15 may have pressure close to air pressure.

When the diaphragms 25 and 45 are not heated, residual gas inside the sample chamber of the electron microscope is degraded by irradiation with an electron beam, so that carbon-based contamination may be deposited there. In the present example, the heater 26 of the upper diaphragm holding part 20 and the heater 46 of the lower diaphragm holding part 40 heat the diaphragms 25 and 45. This can prevent contamination of the diaphragms 25 and 45. The electrodes 38 on the lower face 30*b* of the sample holding plate 30 are connected to the sample 61.

Figure 14:
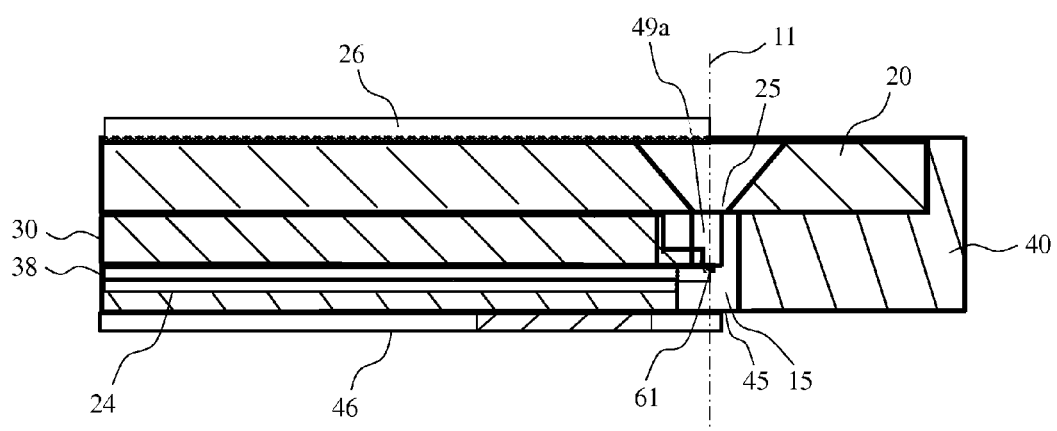
FIG. 14 is a cross-sectional view of another sample holding assembly in the assembled state of the sample holding apparatus for electron microscope according to the present invention.

FIG. 14 is a cross-sectional view of another sample holding assembly in the assembled state of the sample holding apparatus for electron microscope according to the present invention. In the drawing, like reference numerals designate like parts described in the embodiment of FIG. 5 to omit their duplicated description.

Between two diaphragms of an upper diaphragm 25 and a lower diaphragm 45, a cell 15 is formed, and at a center of the cell 15, a sample 61 is disposed. The upper diaphragm 25, the sample 61 and the lower diaphragm 45 are disposed along the optical axis 11 of the electron beam. To the sample 61, electrodes 38 of the sample holding plate 30 are connected. The electrodes 38 are covered with an insulating film 24 at a part other than a connecting part with the sample 61 and a contacting part with wiring connected to a power supply for voltage application. To the cell 15, gas or liquid is introduced via a flow channel 49*a*. Thereby, voltage can be applied to the sample 61 in any atmosphere. In the present example, a heater 26 of the upper diaphragm holding part 20 and a heater 46 of the lower diaphragm holding part 40 are disposed in the vicinity of the upper diaphragm 25 and the lower diaphragm 45, respectively. The heaters 26 and 46 heat the upper diaphragm 25 and the lower diaphragm 45, respectively. This can prevent residual gas inside the sample chamber of the electron microscope from being degraded by irradiation with an electron beam and so can prevent deposition of carbon-based contamination there.

Referring to FIGS. 6A to 6E, the following describes how to take out a sample 61 that is to be fixed at the protrusion 31 of the sample holding plate 30 of the sample holding apparatus for electron microscope according to the present invention.

Figure 6A:
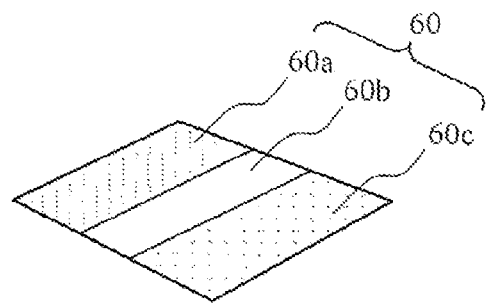
FIG. 6A illustrates how to take out a sample that is to be fixed at a sample holding plate of the sample holding apparatus for electron microscope according to the present invention.
Figure 6B:
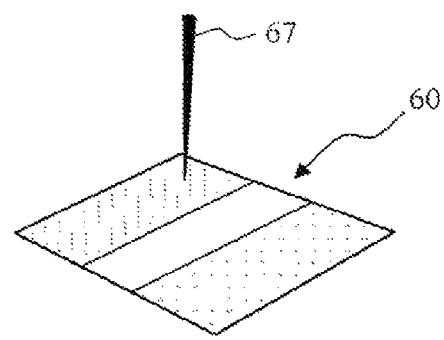
FIG. 6B illustrates how to take out a sample that is to be fixed at a sample holding plate of the sample holding apparatus for electron microscope according to the present invention.
Figure 6C:
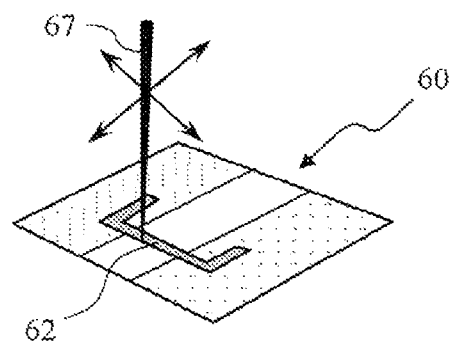
FIG. 6C illustrates how to take out a sample that is to be fixed at a sample holding plate of the sample holding apparatus for electron microscope according to the present invention.

As illustrated in FIG. 6A, a sample 60 as a base material including a region to be observed is prepared. In this example, a sample face including the region to be observed includes three materials 60a, 60b and 60c. As illustrated in FIG. 6B, the sample 60 is irradiated with a focused ion beam (FIB) 67. As illustrated in FIG. 6C, a groove 62 is formed so as to surround the region to be observed. Herein, the groove 62 is formed so as to leave a part of the surroundings of the region to be observed. The sample has a wedge shape. Therefore, to form the groove 62 in the longitudinal direction, the sample 60 is inclined so that the focused ion beam (FIB) 67 is inclined with respect to the normal line of the surface of the sample 60.

Figure 6D:
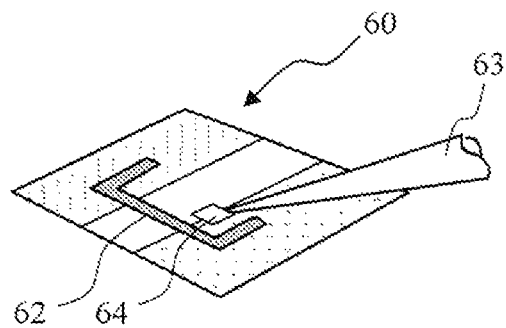
FIG. 6D illustrates how to take out a sample that is to be fixed at a sample holding plate of the sample holding apparatus for electron microscope according to the present invention.
Figure 6E:
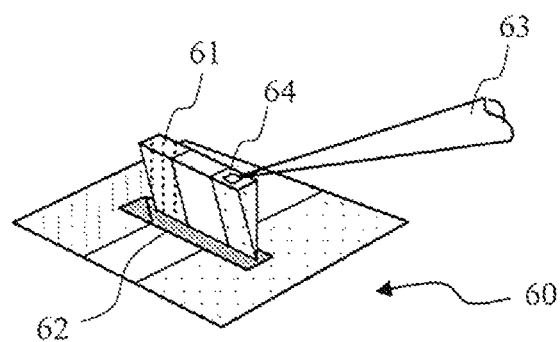
FIG. 6E illustrates how to take out a sample that is to be fixed at a sample holding plate of the sample holding apparatus for electron microscope according to the present invention.

As illustrated in FIG. 6D, a leading end of a metal microprobe 63 of the FIB apparatus is brought into contact with or positioned closer to a part to be extracted, i.e., the part to be a sample, at which a FIB assist metal deposition film 64 is formed, The leading end of the probe 63 is then fixed to the surface of the sample 60 by the deposition film 64. As illustrated in FIG. 6E, a part not processed around the sample 60 is processed by the focused ion beam (FIB) 67, thus cutting the sample 61 from the sample 60. The sample 61 is extracted in the state of being connected to the metal microprobe 63.

Figure 7A:
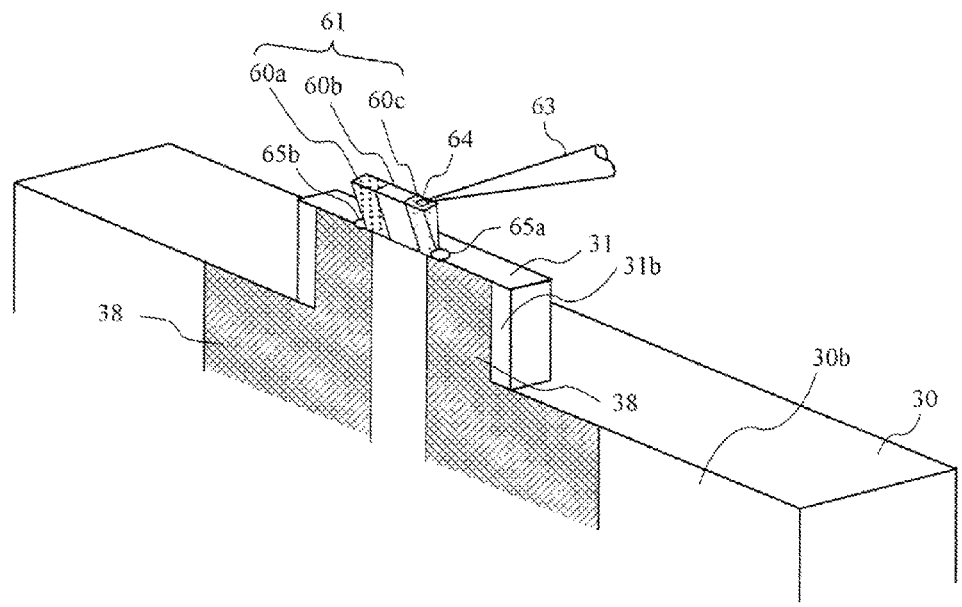
FIG. 7A illustrates how to fix a sample at a sample holding plate of the sample holding apparatus for electron microscope according to the present invention.
Figure 7B:
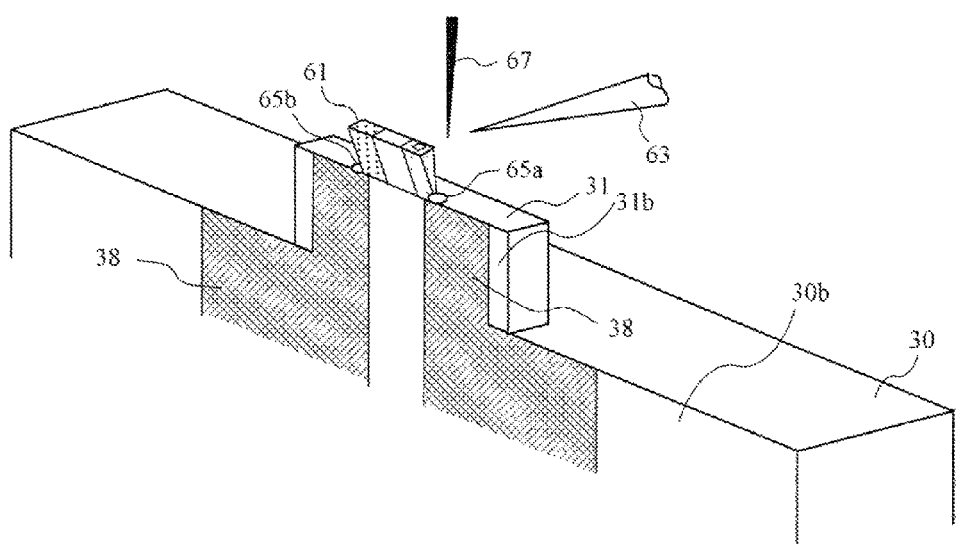
FIG. 7B illustrates how to fix a sample at a sample holding plate of the sample holding apparatus for electron microscope according to the present invention.
Figure 7C:
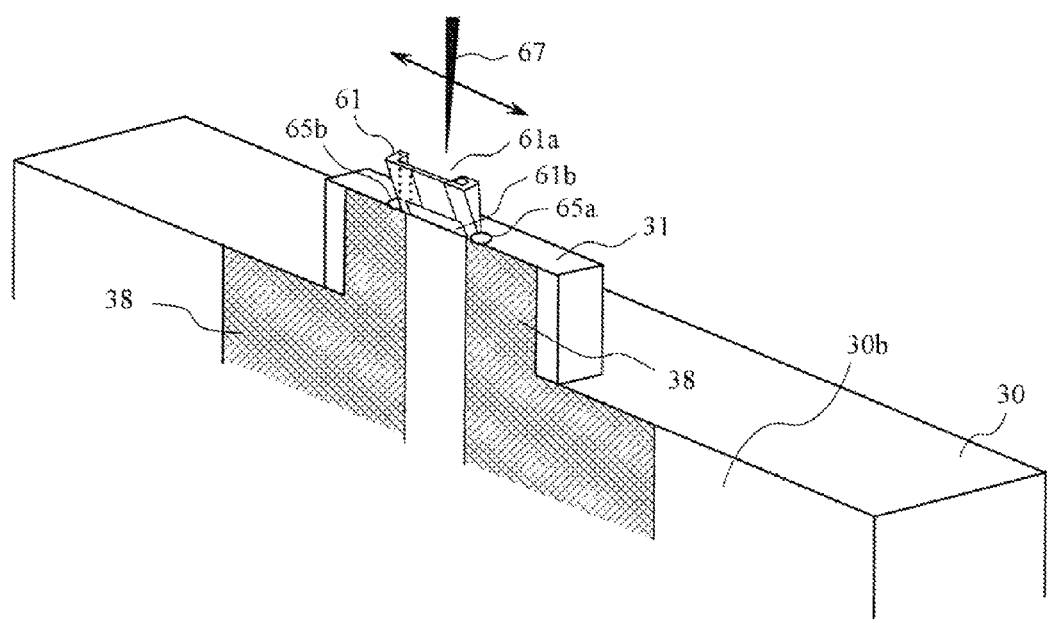
FIG. 7C illustrates how to fix a sample at a sample holding plate of the sample holding apparatus for electron microscope according to the present invention.

Referring to FIGS. 7A, 7B and 7C, the following describes how to fix the sample 61 to be observed with an electron microscope at the sample holding plate 30 of the sample holding apparatus for electron microscope according to the present invention, and connect the sample 61 to the electrodes 38.

FIG. 7A illustrates the state where the sample 61 connected to the metal probe 63 is mounted on an end face of the protrusion 31 of the sample holding plate 30. The sample holding plate 30 is disposed so that the end face of the protrusion 31 becomes orthogonal to the optical axis of the focused ion beam (FIB) 67.

Both ends of the lower end of the sample 61 are fixed to the end face of the protrusion 31 by FIB assist metal deposition films 65a and 65b.

The lower face 31b of the protrusion 31 of the sample holding plate 30 is coplanar with the lower face 30b of the sample holding plate 30. The two electrodes 38, 38 are formed to extend from the lower face 30b of the sample holding plate 30 to the lower face 31b of the protrusion 31. The sample 61 is made of the three materials 60a, 60b and 60c. The two materials 60a and 60c on both sides of the sample 61 are connected to the two electrodes 38 and 38, respectively. Thereby, a predetermined voltage can be applied between the two materials 60a and 60c on both sides of the sample 61.

As illustrated in FIG. 7B, the metal microprobe 63 is detached from the sample 61 by the focused ion beam (FIB) 67. For instance, it may be detached by removing the metal deposition film 64. Thus, the wedge-shaped sample 61 in an erect state is mounted on the end face of the protrusion 31 of the sample holding plate 30. As illustrated in the drawing, the wedge-shaped sample 61 protrudes from the lower face 31b of the protrusion 31. That is, the sample 61 to be observed with the electron microscope is disposed so as to protrude from a plane including the lower face 31b of the protrusion 31.

As illustrated in FIG. 7C, the sample 61 fixed at the protrusion 31 is processed by the focused ion beam (FIB) 67. In the present example, a groove 61a is formed at one of two side faces of the erect sample 61, so that a thin-plate like part is formed at the sample 61. The two side faces of the wedge-shaped sample 61 are inclined to each other. Therefore, formation of the groove 61a at one of the side faces causes formation of a hole 61b at the other side face. The thus formed hole 61b electrically isolates the two materials 60a and 60c on both sides of the sample 61.

Figure 8:
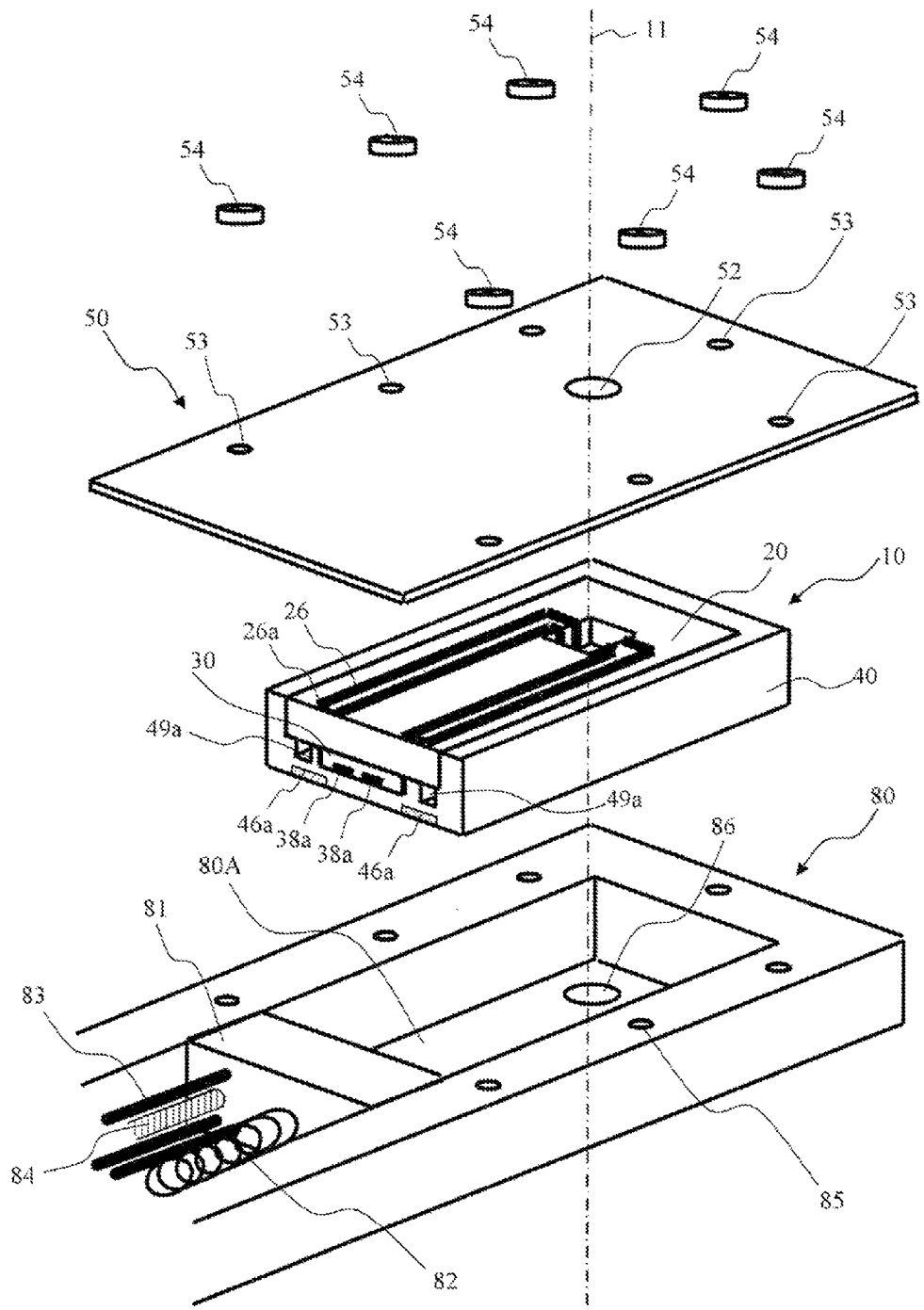
FIG. 8 is an exploded perspective view of an exemplary sample holding apparatus for electron microscope according to the present invention.

FIG. 8 illustrates an exemplary configuration of a sample holding apparatus for electron microscope 80 according to the present invention at the leading end part. The sample holding apparatus 80 includes a holding part 80A that holds a sample holding assembly 10. In this example, the holding part 80A has a recess formed with a frame member. The holding part 80A has a bottom face, in which an electron beam passage hole 86 is formed to pass an electron beam therethrough. The frame member of the holding part 80A includes an engagement member 81. The engagement member 81 is movable and is configured so as to be pressed against the sample holding assembly 10 by a compressive force of a spring 82. To the engagement member 81, conductive wires 83 for connection to the heaters 26 and 46 and the electrodes 38, and a conduit pipe 84 for connection to the flow channel 49a are connected. The engagement member 81 may be made of a non-conductive ceramic material.

The sample holding assembly 10 includes the upper diaphragm holding part 20, the sample holding plate 30 and the lower diaphragm holding part 40, and three end faces of them make up a common end face of the sample holding assembly 10. At the end face of the sample holding assembly 10, the flow channel 49a is exposed. Terminals 38a of the electrodes 38 and terminals 26a and 46a for the heaters 26 and 46 are also provided at the end face. The sample holding assembly 10 is disposed in the holding part 80A of the sample holding apparatus 80, and then the engagement member 81 is moved so as to come into contact with the end part of the sample holding assembly 10. Then, the conductive wires 83 provided at the engagement member 81 are connected to the terminals 26a, 46a of the heaters and the terminals 38a of the electrodes 38, and the conduit pipe 84 provided at the engagement member 81 is connected to the flow channel 49a.

A retainer plate 50 is mounted on the sample holding assembly 10. Screws 54 are inserted into holes 53 of the retainer plate 50 so as to be engaged in screw holes 85 formed at the frame member of the sample holding apparatus 80, whereby the retainer plate 50 is fixed. The retainer plate 50 fixes the sample holding assembly 10 at the sample holding apparatus 80. The retainer plate 50 is provided with an electron beam passage hole 52 to pass an electron beam therethrough.

Figure 9A:
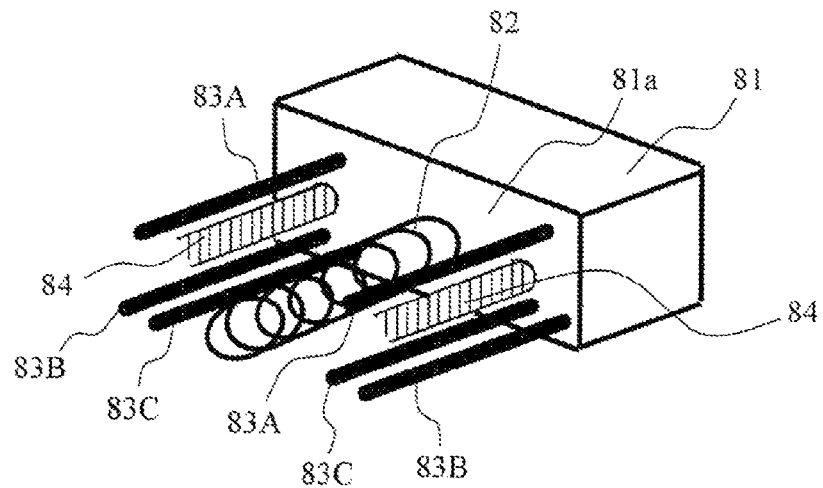
FIG. 9A is a perspective view of an engagement member of a sample holding apparatus for electron microscope according to the present invention.
Figure 9B:
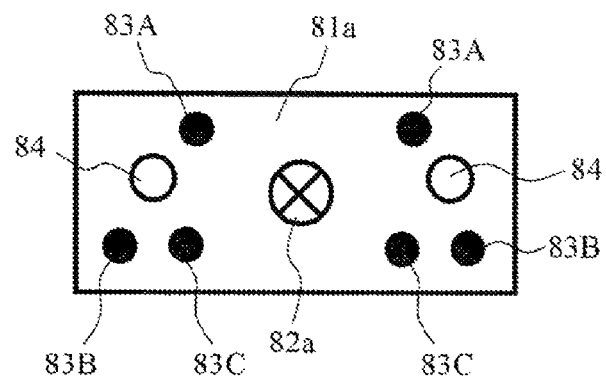
FIG. 9B is one side view of the engagement member of a sample holding apparatus for electron microscope according to the present invention.
Figure 9C:
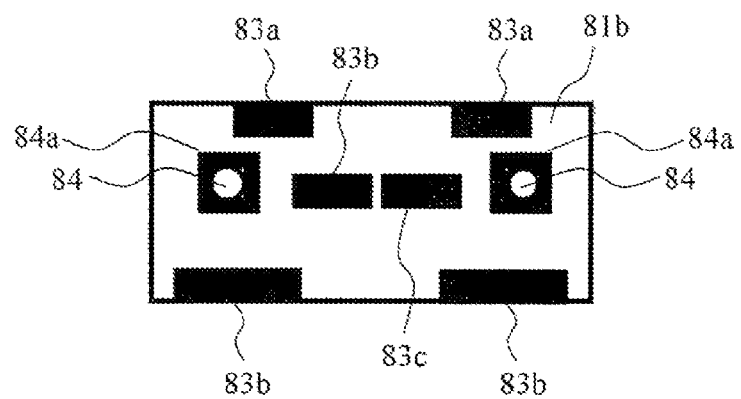
FIG. 9C is the other side view of the engagement member of a sample holding apparatus for electron microscope according to the present invention.

FIG. 9A is a perspective view of the engagement member 81 of the sample holding apparatus 80 for electron microscope, and FIGS. 9B and 9C are its side views. As illustrated in FIGS. 9A and 9B, the engagement member 81 has a first end face 81a, at which the spring 82 pressing the engagement member 81, the conduit pipe 84 for connection to the flow channel 49a, conductive wires 83A, 83B to supply electricity to the heaters 26 and 46, and a conductive wire 83C for connection to the electrodes 38 are provided. The conduit pipe 84 and the conductive wires 83A, 83B and 83C extend from the first end face 81a of the engagement member 81 to a second end face 81b thereof.

As illustrated in FIG. 9C, gaskets 84a are mounted at the second end face 81b of the engagement member 81 so as to surround the conduit pipe 84. The gaskets provided prevent the leakage of gas or liquid at the second end face 81*b* of the engagement member 81. The conductive wires 83A, 83B and 83C are connected to terminals 83*a*, 83*b* and 83*c* provided at the second end face 81*b* of the engagement member 81, respectively.

In this example, the spring 82 is used to fix the engagement member 81, and another mechanism may be used to fix the engagement member 81. As long as the engagement member 81 is pressed for fixing similarly to the spring 82, a screw mechanism, for example, may be used. In the case of the screw mechanism, a screw hole is provided at the engagement member 81 as a movable part, and a screw shaft engaging therein is rotatably attached to a fixing part. Rotation of the screw shaft attached to the fixing part moves the engagement member 81 relative to the fixing part. When the engagement member 81 is simply fixed, the engagement member 81 may be fixed by a screw to the frame member of the sample holding apparatus 80.

Figure 10A:
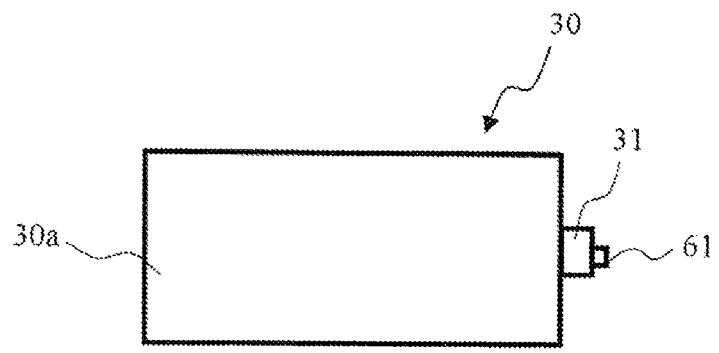
FIG. 10A is a top view of a second exemplary sample holding plate of the sample holding assembly of the sample holding apparatus for electron microscope according to the present invention.
Figure 10B:
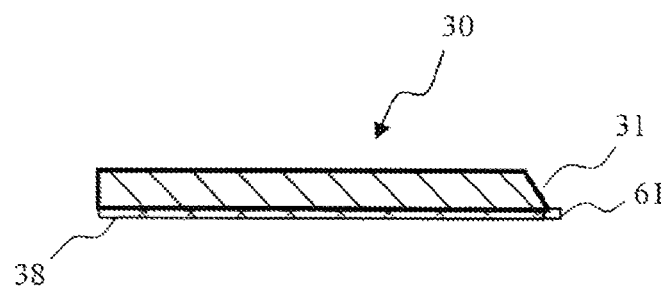
FIG. 10B is a cross-sectional view of the second exemplary sample holding plate of the sample holding assembly of the sample holding apparatus for electron microscope according to the present invention.
Figure 10C:
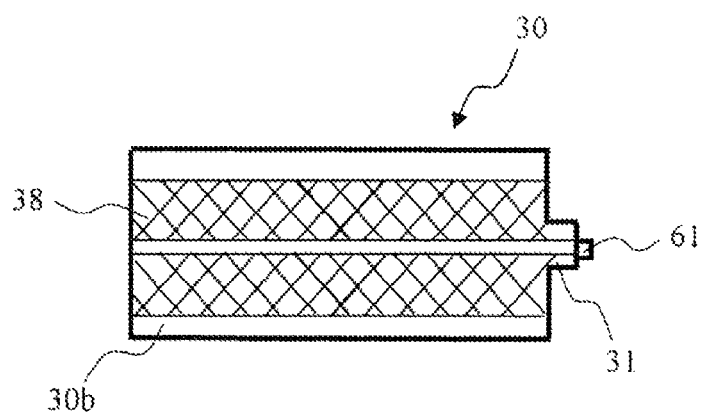
FIG. 10C is a bottom view of the second exemplary sample holding plate of the sample holding assembly of the sample holding apparatus for electron microscope according to the present invention.

Referring of FIGS. 10A, 10B and 10C, the following describes a second example of the sample holding plate 30. A protrusion 31 of the sample holding plate 30 of this example has a tapered shape, at a leading end of which a sample 61 to be observed with an electron microscope is attached. In the sample holding plate 30 of the present example, electrodes 38 are provided at a lower face 30*b* thereof, but they may be provided at an upper face 30*a*.

Figure 11A:
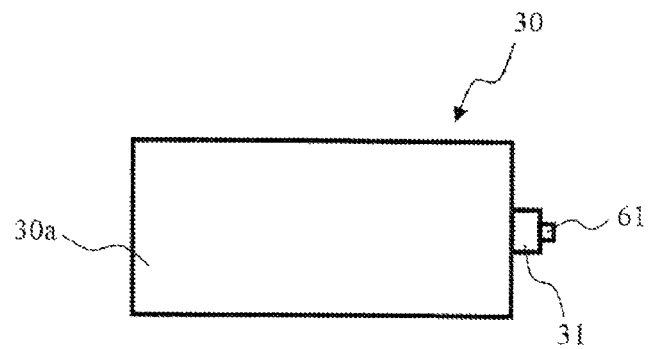
FIG. 11A is a top view of a third exemplary sample holding plate of the sample holding assembly of the sample holding apparatus for electron microscope according to the present invention.
Figure 11B:
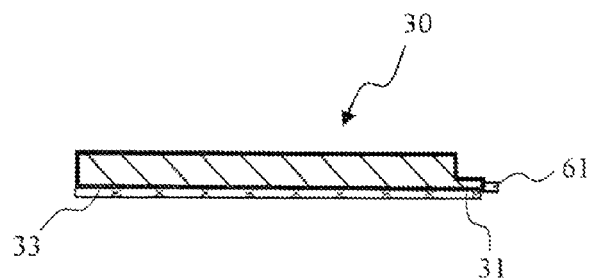
FIG. 11B is a cross-sectional view of the third exemplary sample holding plate of the sample holding assembly of the sample holding apparatus for electron microscope according to the present invention.
Figure 11C:
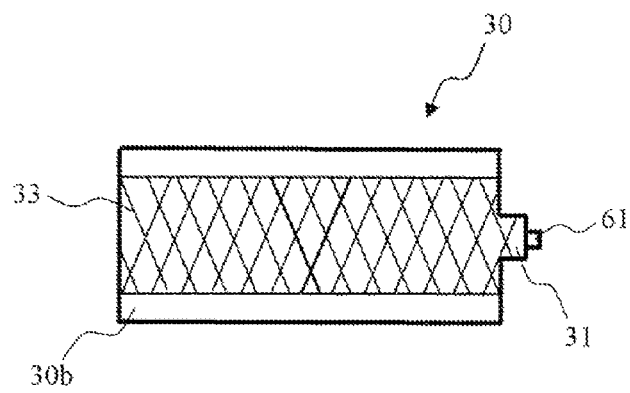
FIG. 11C is a bottom view of the third exemplary sample holding plate of the sample holding assembly of the sample holding apparatus for electron microscope according to the present invention.

Referring to FIGS. 11A, 11B and 11C, the following describes a third example of the sample holding plate 30. The sample holding plate 30 of this example includes a heater 33 at its lower face 30*b*. The heater 33 extends to a protrusion 31 of the sample holding plate 30. Therefore the sample 61 attached to the protrusion 31 of the sample holding plate 30 can be directly brought into contact with the heater 33. Thus, the sample 61 can be heated in special atmosphere of the cell. The sample holding plate 30 of the present example is provided with electrodes 38 not illustrated at the lower face 30*b* or the upper face 30*a*.

Figure 15A:
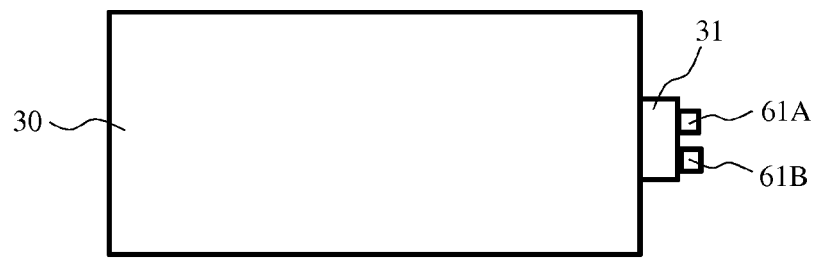
FIG. 15A is a top view of still another exemplary sample holding plate of the sample holding assembly of the sample holding apparatus for electron microscope according to the present invention.
Figure 15B:
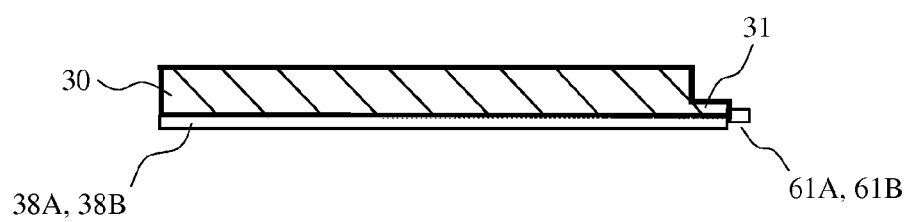
FIG. 15B is a cross-sectional view of the other exemplary sample holding plate of the sample holding assembly of the sample holding apparatus for electron microscope according to the present invention.
Figure 15C:
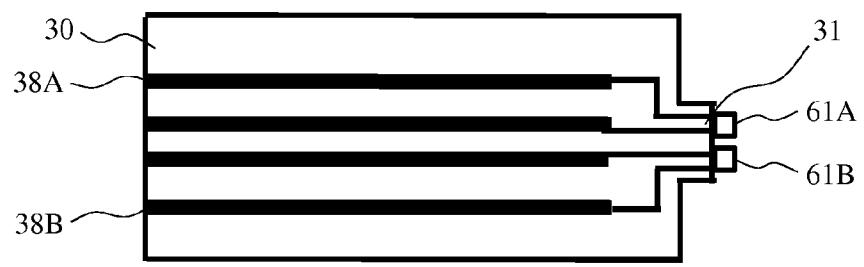
FIG. 15C is a bottom view of still the other exemplary sample holding plate of the sample holding assembly of the sample holding apparatus for electron microscope according to the present invention.

Referring of FIGS. 15A, 15B and 15C, the following describes another exemplary sample holding plate 30. This sample holding plate 30 has a protrusion 31, at which a plurality of samples 61A and 61B are attached. The sample holding plate 30 has a lower face, at which a plurality of electrodes 38A and 38B are provided. The electrodes 38A and 38B are connected to the samples 61A and 61B, respectively. In this example, the plurality of samples 61A and 61B made of the same material are attached to the protrusion 31, to each of which different voltage is applied via the plurality of electrodes 38A and 38B. This allows voltage dependency of a change of the samples 61A and 61B in the same environment such as the amount of irradiation with electron beam and sample atmosphere to be understood precisely. Alternatively, the sample 61A of the plurality of samples 61A and 61B is processed into a thin film and is then inserted into an electron microscope, and the other sample 61B is not processed and is inserted into the electron microscope, to which the same voltage is applied in the same environment. Then, after observation of the sample 61A subjected to thin-film processing, the sample 61A is inserted into a focused ion beam processing apparatus. The other sample 61B, which is not subjected to thin-film processing, is then processed into a thin film, and such a sample 61B is inserted into the electron microscope for observation. Observation of these two samples 61A and 61B enables a comparison between the case of applying a voltage to the thin-filmed sample and the case of applying the voltage to the thick sample.

Figure 16A:
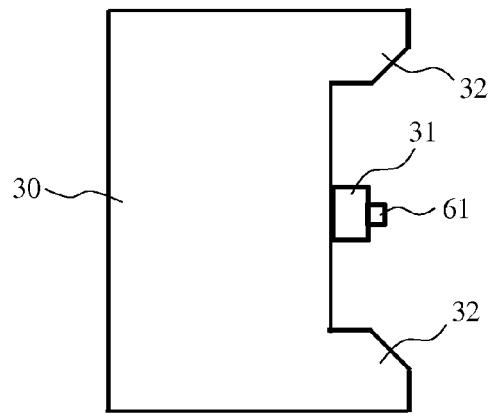
FIG. 16A is a top view of a further exemplary sample holding plate of the sample holding assembly of the sample holding apparatus for electron microscope according to the present invention.
Figure 16B:
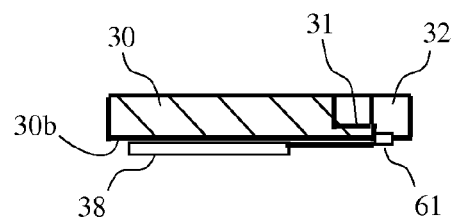
FIG. 16B is a cross-sectional view of the other exemplary sample holding plate of the sample holding assembly of the sample holding apparatus for electron microscope according to the present invention.
Figure 16C:
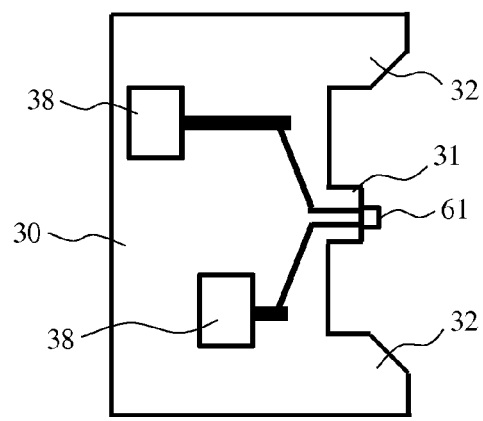
FIG. 16C is a bottom view of the other exemplary sample holding plate of the sample holding assembly of the sample holding apparatus for electron microscope according to the present invention.

The sample holding plates 30 illustrated in FIGS. 4A to 4C, FIGS. 10A to 10C, FIGS. 11A to 11C, FIGS. 13A to 13C and FIGS. 15A to 15C may be used alone. Referring to FIGS. 16A, 16B and 16C, the following describes an embodiment of the sample holding plate 30 that is used alone.

As illustrated in FIG. 16A, the sample holding plate 30 has one end, at which a protrusion 31 is formed, and at a leading end of the protrusion 31, a sample 61 is attached. The protrusion 31 extends along the lower face 30*b* of the sample holding plate 30 and has a thin plate-like shape. In this example, the sample holding plate 30 has protection parts 32 on both sides of the protrusion 31 so that the protection parts 32 extend in the same direction as the protrusion 31. The two protection parts 32 are positioned opposite to each other while sandwiching the protrusion 31 therebetween. At the lower face 30*b* of the sample holding plate 30, electrodes 38 are provided. The electrodes 38 are disposed along the lower face 30*b* of the sample holding plate 30 and extend to the lower face of the protrusion 31. The electrodes 38 are connected to the sample 61. In this way, in the configuration for use of the sample holding plate 30 alone, the protection parts 32 are provided so as to extend parts of the sample holding plate 30 partially, whereby breakage of the protrusion 31 to attach the sample 61 can be prevented. Especially due to the configuration of the protection parts 32 that are opposed to sandwich the protrusion 31 therebetween, directly contact of the sample 61 with tweezers and the like, which are used for handling, can be prevented.

Figure 17A:
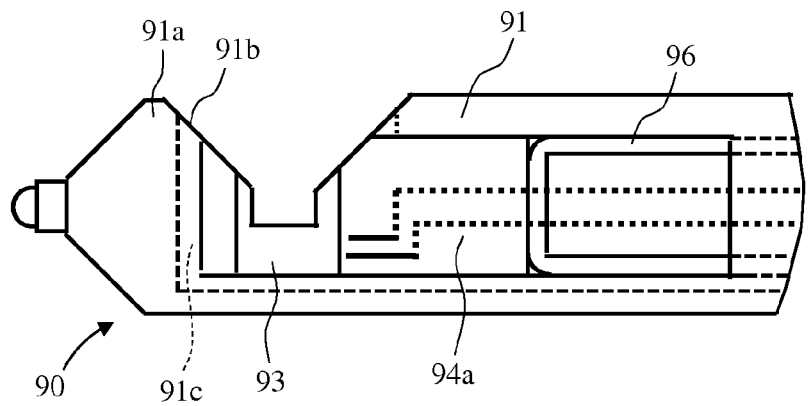
FIG. 17A illustrates a leading end of a FIB-TEM/STEM compatible holder according to the present invention.
Figure 17B:
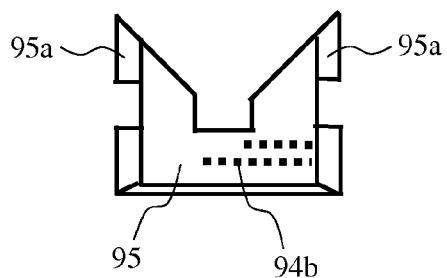
FIG. 17B illustrates a fixing part of the FIB-TEM/STEM compatible holder according to the present invention.
Figure 17C:
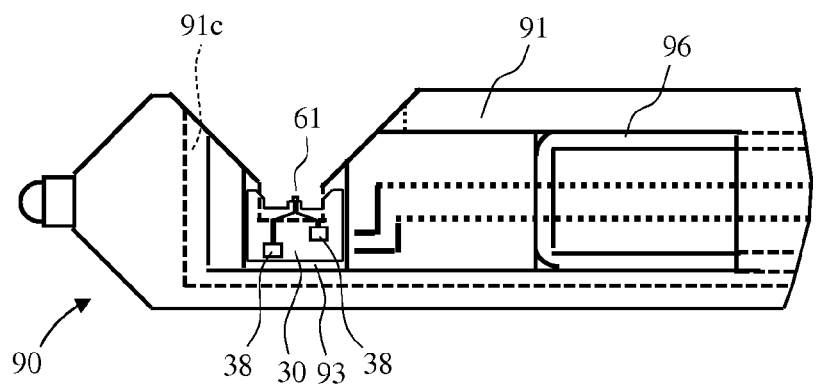
FIG. 17C illustrates a leading end of the FIB-TEM/STEM compatible holder according to the present invention.
Figure 17D:
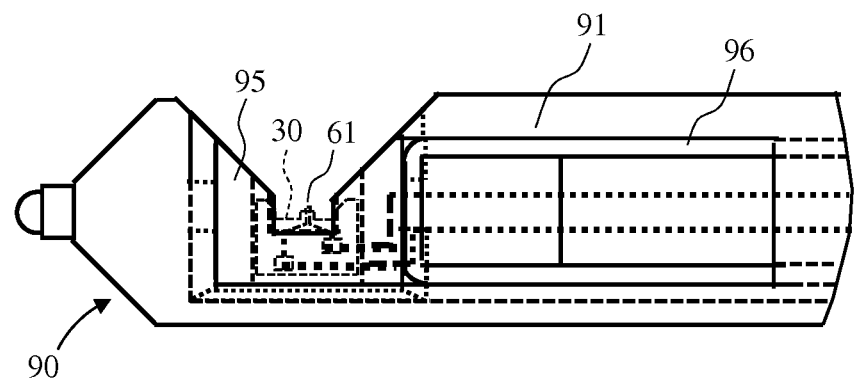
FIG. 17D illustrates a leading end of the FIB-TEM/STEM compatible holder according to the present invention.

FIGS. 17A, 17B, 17C and 17D illustrate a FIB-TEM/STEM compatible holder in the example for use of the sample holding plate 30 alone. FIG. 17A illustrates a leading end part of the FIB-TEM/STEM compatible holder. FIG. 17B illustrates a fixing part where a sample holding plate is to be fixed. FIG. 17C illustrates the leading end part of the FIB-TEM/STEM compatible holder, on which the sample holding plate is mounted. FIG. 17D illustrates the leading end part of the FIB-TEM/STEM compatible holder, to which the sample holding plate is fixed.

The FIB-TEM/STEM compatible holder 90 includes a hollow outer shaft (see FIG. 18A) and an inner shaft 91 that is concentric with the outer shaft. The compatible holder 90 has a mechanism that rotates the inner shaft 91. The inner shaft 91 has a leading end 91*a* provided with a notch 91*b* formed in an incident direction of a focused ion beam. A fixing groove 93 is provided to hold a sample holding plate at a position of the notch 91*b* of the leading end 91*a* of the inner shaft 91. The sample holding plate 30 is fitted into the fixing groove 93.

Conductive wires 94*a* are disposed for voltage application inside the inner shaft 91. Ends of the conductive wires 94*a* extend to the vicinity of the fixing groove 93 and are fixed thereto. As illustrated in FIG. 17B, the compatible holder 90 includes a fixing part 95 that fixes a sample holding plate. The fixing part 95 has a tapered part 95*a*. The tapered part 95*a* becomes gradually thinner toward the outer edge of the fixing part 95 so as to be engaged in the tapered part 91*c* provided in the inner shaft 91. The fixing part 95 is provided with conductive wires 94*b*. The conductive wires 94*b* extend so as to connect the conductive wires 94*a* of the inner shaft 91 to the electrodes 38 of the sample holding plate 30 when the fixing part 95 is fitted at the position of the fixing groove 93. A retainer spring 96 is further provided in the inner shaft 91 to fix the fixing part 95. The retainer spring 96 is configured to move to the position of the fixing groove 93 along the inner shaft 91.

To fix the sample holding plate 30, the sample holding plate 30 is firstly mounted on the fixing groove 93 of the inner shaft 91 (FIG. 17C). Thereafter, the fixing part 95 is fitted at the position of the fixing groove 93. At this time, the fixing part 95 is fitted so that the tapered part 95*a* of the fixing part 95 and a tapered part 91c provided at the inner shaft 91 are mated each other. The fixing part 95 is then fitted so that the face of the fixing part 95 provided with the conductive wires 94b comes into contact with the face of the sample holding plate 30 provided with conductive wires, so that the conductive wires 94b of the fixing part 95 and the electrodes 38 of the sample holding plate 30 come into contact with each other. Then, the retainer spring 96 is moved to the position of the fixing groove 93 to retain the fixing part 95 so that the fixing part 95 is fixed at the leading end 91a of the inner shaft 91 (FIG. 17D). At this time, the conductive wires 94a provided at the inner shaft 91 come into contact with the conductive wires 94b of the fixing part 95. Thereby, the conductive wires 94a in the inner shaft 91 are connected to the electrodes 38 of the sample holding plate 30 via the conductive wires 94b of the fixing part 95, whereby voltage can be applied to the sample. Such a configuration allows the steps of the extraction from a desired part, the preparation of a thin-film sample and the observation with TEM/STEM using the same FIB-TEM/STEM compatible holder.

Figure 18A:
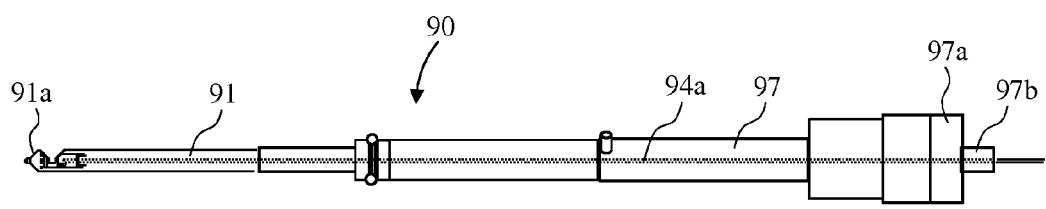
FIG. 18A illustrates a FIB-TEM/STEM compatible holder as a whole according to the present invention.
Figure 18B:
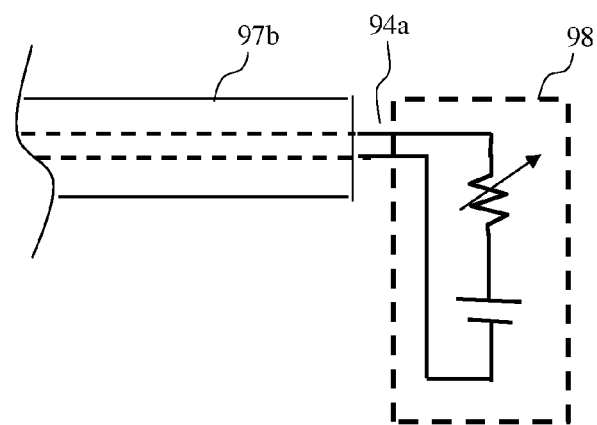
FIG. 18B is an enlarged view of a rear end of the FIB-TEM/STEM compatible holder according to the present invention.

FIG. 18A illustrates the overall configuration of the FIB-TEM/STEM compatible holder in one embodiment. FIG. 18B is an enlarged view of the FIB-TEM/STEM compatible holder at is rear end in one embodiment. In these drawings, like reference numerals designate like parts described in the above example to omit their duplicated description.

A compatible holder 90 includes a hollow outer shaft 97 and the inner shaft 91 that is concentric with the outer shaft 97. In this embodiment, a rear end 97a of the outer shaft 97 has a knob 97b. The knob 97b is connected to the inner shaft 91 inside the hollow outer shaft 97, and turning of the knob 97b allows rotation of the inner shaft 91. As illustrated in FIGS. 17A to 17D, the sample holding plate 30 is fixed at the leading end 91a of the inner shaft 91. The knob 97b allows, after fixing the sample holding plate 30 to the leading end 91a of the inner shaft 91, the inner shaft 91 to rotate and so rotates the sample holding plate 30 360 degrees. The conductive wires 94a provided in the inner shaft 91 for voltage application extend through the inside the outer shaft 97 and the knob 97b and are connected to an external power supply 98 for voltage application. Such a compatible holder 90 allows a sample processed with focused ion beam (FIB) to be inserted into a transmission electron microscope (TEM) for observation and analysis without mounting the sample to a different position. The same processing position and observation position of the sample can be repeatedly produced by simple procedure of rotating the inner shaft 91 90 degrees using the knob 97b.

Figure 19A:
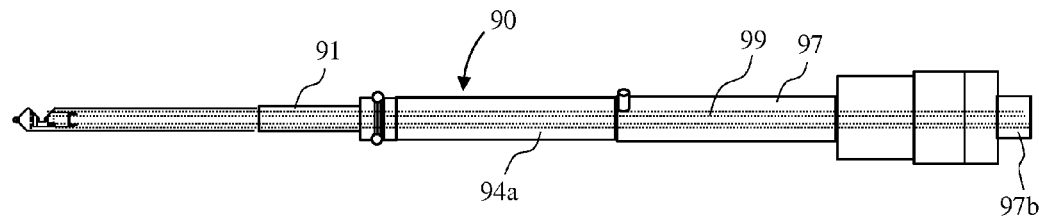
FIG. 19A illustrates another exemplary FIB-TEM/STEM compatible holder as a whole according to the present invention.
Figure 19B:
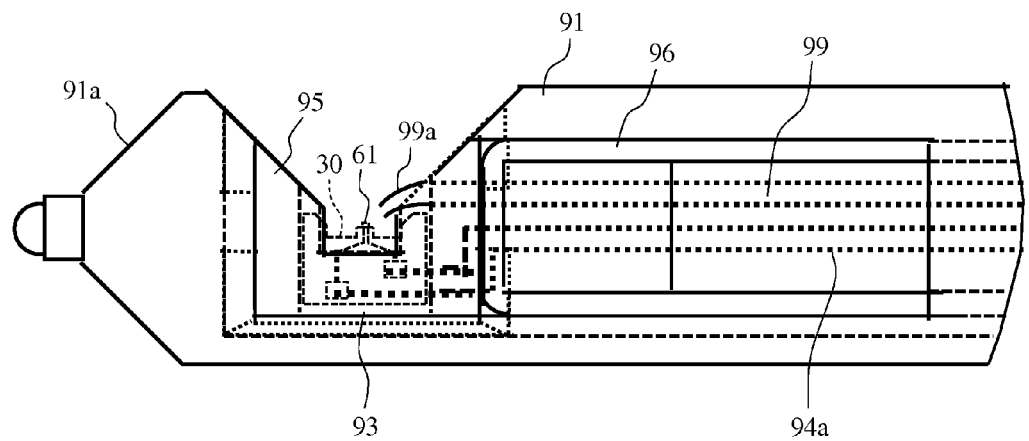
FIG. 19B is an enlarged view of a leading end of the other exemplary FIB-TEM/STEM compatible holder according to the present invention.

FIG. 19A illustrates the overall configuration of a FIB-TEM/STEM compatible holder in another embodiment. FIG. 19B is an enlarged view of the FIB-TEM/STEM compatible holder at is leading end in the other embodiment.

Figure 19C:
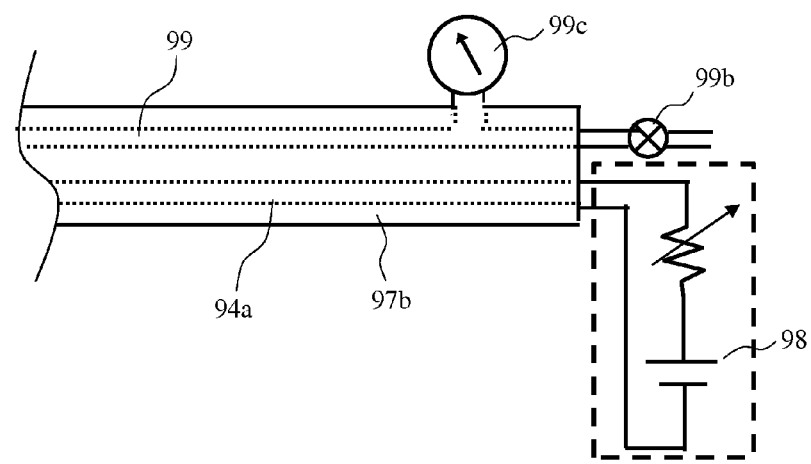
FIG. 19C is an enlarged view of a rear end of the other exemplary FIB-TEM/STEM compatible holder according to the present invention.

FIG. 19C is an enlarged view of the FIB-TEM/STEM compatible holder at is rear end in the other embodiment. In these drawings, like reference numerals designate like parts described in the above example to omit their duplicated description.

In this embodiment, the compatible holder 90 includes a gas inlet pipe 99 to supply gas to a sample, in addition to the conductive wires 94a provided inside the inner shaft 91 for voltage application. The gas inlet pipe 99 extends to the leading end 91a of the inner shaft 91 through the inside of a knob 97b, the inside of the outer shaft 97 and the inside of the inner shaft 91. A leading end 99a of the gas inlet pipe 99 extends so as to stick out from a position above the fixing groove 93. The leading end 99a of the gas inlet pipe 99 then extends toward the sample 61 while bending, thus enabling introduction of gas to the sample 61 (FIG. 19B). The gas inlet pipe 99 is connected to an external gas supplying apparatus (not illustrated) via a valve 99b (FIG. 19C). Such a gas supplying apparatus can introduce gas to the sample 61 at the leading end 91a of the inner shaft 91 via the gas inlet pipe 99. The gas inlet pipe 99 is provided with a flow meter 99c. This allows the introduction of gas to the sample 61 at any pressure atmosphere and allows the observation of a change in such atmosphere. For instance, this enables an interface between an electrolyte membrane and an electrode of a fuel cell to be extracted with a focused ion beam (FIB) and enables voltage application and heating thereto in hydrogen or water vapor atmosphere close to the actual operation environment of the fuel cell. This allows evaluation of the deterioration of the fuel cell at high resolution.

Figure 12:
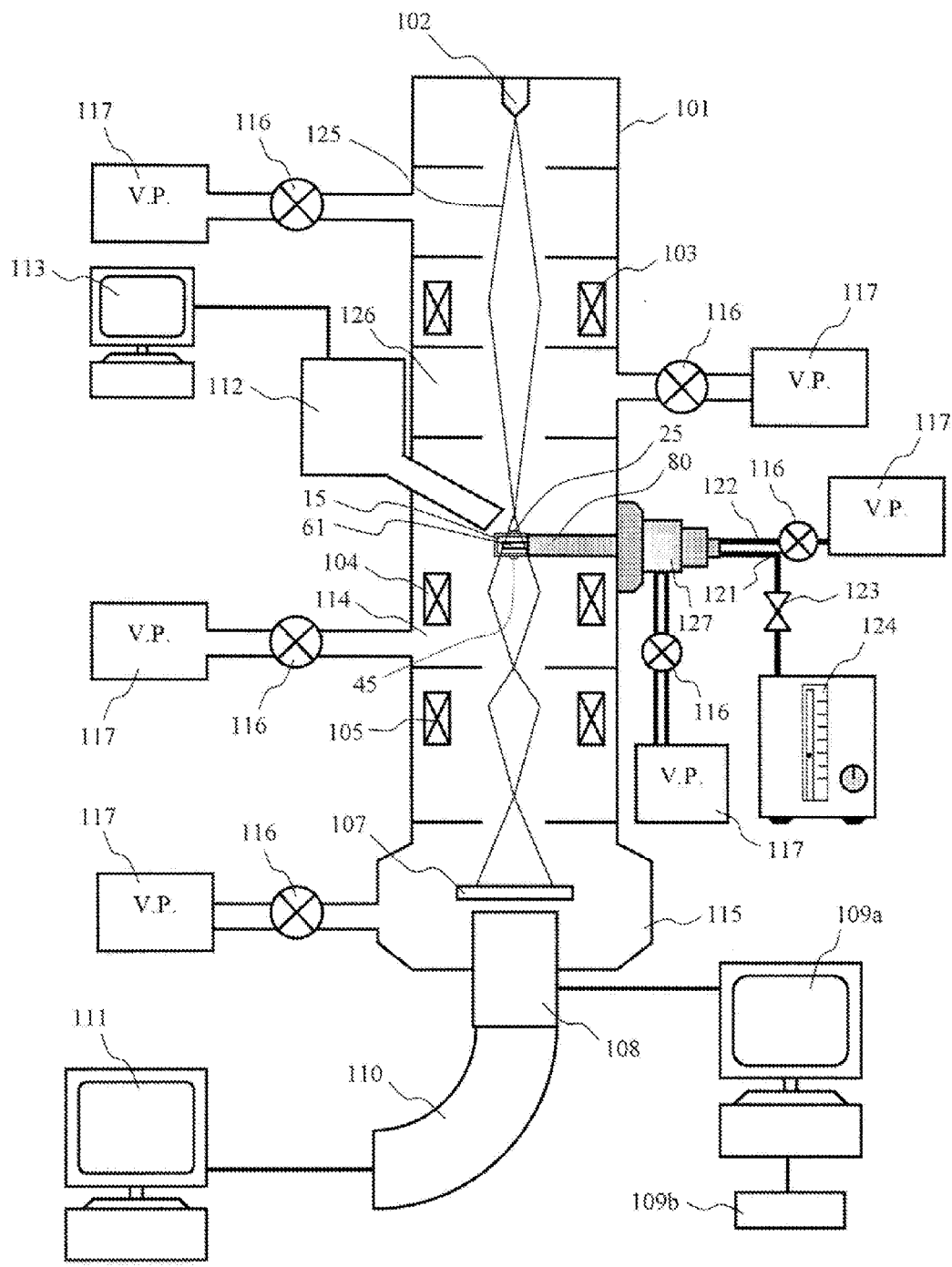
FIG. 12 illustrates an exemplary electron microscope according to the present invention.

Referring to FIG. 12, an exemplary electron microscope of the present invention is described below. The aforementioned sample holding apparatus for electron microscope and sample holding assembly are applicable to transmission electron microscopes (TEM) and scanning transmission electron microscopes (STEMs). The following exemplifies the case of a transmission electron microscope. The transmission electron microscope has a lens barrel 101 including an electron gun 102, a condenser lens 103, an object lens 104 and a projection lens 105, which make up an electron beam optical system. An internal chamber 126 is provided below the condenser lens 103, below which a sample chamber 114 is provided.

A sample holding apparatus for electron microscope 80 and an energy dispersive X-ray spectroscopy (EDX) detector 112 are inserted into the sample chamber 114. The sample holding apparatus 80 includes a cell 15, in which a sample 61 is loaded. The sample 61 is disposed on the optical axis of an electron beam 125. The EDX detector 112 is connected to an EDX controller 113 equipped with a display device.

An observation chamber 115 is provided below the projection lens 105. The observation chamber 115 is provided with a fluorescent plate 107. A TV camera 108 is mounted below the fluorescent plate 107. The TV camera 108 is connected to an image display device 109a and an input device 109b. An electron energy-loss spectroscopy (EELS) detector 110 is provided below the TV camera 108. The EELS detector 110 is connected to an EELS controller 111 equipped with a display device.

The internal chamber 126, the sample chamber 114 and the observation chamber 115 below the electron gun 102 are each connected to a vacuum pump 117 via a valve 116. The sample holding apparatus for electron microscope 80 also is connected to a vacuum pump 117 via a valve 116.

The cell 15 of the sample holding apparatus for electron microscope 80 is connected to a gas inlet pipe 121 and a gas outlet pipe 122. The gas inlet pipe 121 is connected to a gas storage part 124 via a gas-pressure control valve 123. The gas outlet pipe 122 is connected to a vacuum pump 117 via a valve 116. The gas inlet pipe 121 and the gas outlet pipe 122 are connected to the flow channel 49a of the sample holding assembly 10. Thereby, gas stored at the gas storage part 124 is supplied to the cell 15 of the sample holding apparatus for electron microscope 80 via one part of the flow channel 49a. This gas is then discharged via the other part of the flow channel 49a. The gas introduced to the cell 15 may have pressure close to air pressure, for example. When liquid is introduced to the cell 15 instead of gas, a liquid storage part may be used instead of the gas storage part 124.

The electron beam 125 generated from the electron gun 102 is focused by the condenser lens 103, and is applied to the sample 61 in the cell 15 of the sample holding apparatus for electron microscope 80. The electron beam 125 passing through the sample 61 forms an image via the object lens 104, and the image is enlarged by the projection lens 105. The enlarged transmission image of the sample is projected on the fluorescent plate 107. The transmission image of the sample projected on the fluorescent plate 107 is shot by the TV camera 108. The transmission image of the sample shot by the TV camera 108 is displayed at the image display device 109*a*.

That is the description of embodiments of the present invention. Those skilled in the art would readily appreciate that the present invention is not limited to the aforementioned embodiments and may be modified variously within the scope of the invention recited in the appended claims.

Reference Signs List

10 Sample holding assembly
11 Optical axis of an electron beam
15 Cell
20 Upper diaphragm holding part
20*a* Upper face
20*b* Lower face
21 Recess
25 Diaphragm
26 Heater
30 Sample holding plate
30*a* Upper face
30*b* Lower face
31 Protrusion
33 Heater
38 Electrode
40 Lower diaphragm holding part
40*a* Upper face
40*b* Lower face
41 Recess
45 Diaphragm
46 Heater
47 Recess
48 Recess
49 Groove
49*a* Flow channel
50 Retainer plate
52 Electron beam passage hole
53 Hole
54 Spring
60 Sample
61 Sample
62 Groove
63 Probe
64 Assist metal deposition film
65*a*, 65*b* Assist metal deposition film
67 Focused ion beam (FIB)
80 Sample holding apparatus
80A Holding part
81 Engagement member
82 Spring
83 Conductive wire
84 Conduit pipe
85 Screw hole
90 compatible holder
91 Inner shaft
101 Lens barrel
102 Electron gun
103 Condenser lens
104 Object lens
105 Projection lens
107 Fluorescent plate
108 TV camera
109*a* Image display
109*b* Input device
110 Electron energy-loss spectroscopy (EELS) detector
111 EELS controller
112 Energy dispersive X-ray spectroscopy (EDX) detector
113 EDX controller
114 Sample chamber
115 Observation chamber
116 Valve
117 Vacuum pump
121 Gas inlet pipe
122 Gas outlet pipe
123 Gas-pressure control valve
124 Gas storage part
125 Electron beam
126 Internal chamber

The invention claimed is:

1. A sample holding apparatus capable of mounting to both a focused ion beam device and a transmission electron microscope apparatus, comprising:
   a sample holding assembly including an assembly of three components of an upper diaphragm holding part, a sample holding plate and a lower diaphragm holding part; and
   a holding part that holds the sample holding assembly replaceably, wherein:
   the sample holding assembly includes a cell defined between a diaphragm of the upper diaphragm holding part and a diaphragm of the lower diaphragm holding part, and a flow channel connected to the cell,
   the sample holding plate is provided with a thin plate-like protrusion at its one end,
   a lower face of the protrusion extends along a lower face of the sample holding plate,
   an upper face of the protrusion has a step from an upper face of the sample holding plate,
   the sample holding assembly is configured such that when an extracted sample, which is extracted from a base material by focused ion beam processing, is mounted in an erect state at an end face of the protrusion, the extracted sample is placed in the cell, and
   the sample holding apparatus is configured such that, when the sample holding assembly is placed in the holding part, the diaphragm of the upper diaphragm holding part, the extracted sample and the diaphragm of the lower diaphragm holding part are disposed along an optical axis of an electron beam.

2. The sample holding apparatus according to claim 1, further comprising:
   an engagement member that engages with an end face of the sample holding assembly; and
   a conduit pipe connected to the engagement member for supplying gas or liquid to the flow channel.

3. The sample holding apparatus according to claim 2, further comprising: a heater mounted to at least one of the upper diaphragm holding part and the lower diaphragm holding part, wherein the engagement member includes a terminal for supplying electricity to the heater.

4. The sample holding apparatus tor electron microscope according to claim 2, wherein:
   the sample holding plate includes an electrode connected to the sample mounted at the protrusion, and
   the engagement member includes a terminal for applying voltage to the electrode.

5. The sample holding apparatus according to claim 1, wherein:

the lower diaphragm holding part has a first face including a first recess having a shape corresponding to an outer shape of the upper diaphragm holding part, and the first recess has a bottom face including a second recess having a shape corresponding to an outer shape of the sample holding plate, and the sample holding assembly is assembled by disposing the sample holding plate in the second recess of the lower diaphragm holding part and disposing the upper diaphragm holding part in the first recess of the lower diaphragm holding part so as to cover the sample holding plate.

6. The sample holding apparatus according to claim 1, wherein:

the sample holding plate has a dimension in a longitudinal direction thereof of 4 to 5 mm, has a dimension in a width direction thereof of 2 to 3 mm, and has a thickness of 200 to 500 µm, and the protrusion has a thickness of a part at which the sample is to be mounted of 50 to 10 µm.

7. The sample holding apparatus according to claim 1, wherein:

the protrusion of the sample holding plate is configured so as to support the extracted sample, by fixing the extracted sample with an assist metal deposition film at the end face of the protrusion.

8. The sample holding apparatus according to claim 2, wherein the engagement member of the holding part is configured to come into contact with the end face of the sample holding assembly by an elastic force of a spring.

9. A transmission electron microscope apparatus, comprising:

an electron source that emits an electron beam;

a sample holding apparatus that holds a sample;

an electron beam optical system that focuses an electron beam emitted from the electron source and irradiates the sample with the electron beam; and a display device that displays an image of the sample that is obtained by the irradiation with the electron beam, wherein:

the sample holding apparatus is capable of mounting to both a focused ion beam device and the transmission electron microscope apparatus, the sample holding apparatus includes:

a sample holding assembly including an assembly of three components of an upper diaphragm holding part, a sample holding plate and a lower diaphragm holding part; and a holding part that holds the sample holding assembly replaceably, wherein:

the sample holding assembly includes a cell defined between a diaphragm of the upper diaphragm holding part and a diaphragm of the lower diaphragm holding part, and a flow channel connected to the cell, the sample holding plate is provided with a thin plate-like protrusion at its one end, a lower face of the protrusion extends along a lower face of the sample holding plate, an upper face of the protrusion has a step from an upper face of the sample holding plate, the sample holding assembly is configured such that when an extracted sample, which is extracted from a base material by focused ion beam processing, is mounted in an erect state at an end face of the protrusion, the extracted sample is placed in the cell, and the sample holding apparatus is configured such that, when the sample holding assembly is placed in the holding part, the diaphragm of the upper diaphragm holding part, the extracted sample and the diaphragm of the lower diaphragm holding part of the sample holding assembly disposed at the holding part of the sample holding apparatus are disposed along an optical axis of an electron beam.

10. The transmission electron microscope apparatus according to claim 9, wherein:

the sample holding apparatus further includes an engagement member that engages with an end face of the sample holding assembly, and a conduit pipe is connected to the engagement member for supplying gas or liquid to the flow channel.

11. The transmission electron microscope apparatus according to claim 10, further comprising: a heater mounted to at least one of the upper diaphragm holding part and the lower diaphragm holding part, wherein the engagement member includes a terminal for supplying electricity to the heater.

12. The transmission electron microscope apparatus according to claim 10, wherein:

the sample holding plate includes an electrode connected to the sample mounted at the protrusion, and the engagement member includes a terminal for applying voltage to the electrode.

13. A sample holding assembly capable of mounting to both a focused ion beam device and a transmission electron microscope apparatus, comprising:

an upper diaphragm holding part including a hole extending from a first face to a second face of the upper diaphragm holding part, and a diaphragm that blocks an opening of the hole;

a sample holding plate having one end provided with a protrusion, at which a sample is to be attached; and a lower diaphragm holding part including a hole extending from a first face to a second face of the lower diaphragm holding part, a diaphragm that blocks an opening of the hole, and a groove connected to the hole, wherein:

by assembling three components of the upper diaphragm holding part, the sample holding plate and the lower diaphragm holding part so as to sandwich the sample holding plate between the upper diaphragm holding part and the lower diaphragm holding part, a cell is formed between the diaphragm of the upper diaphragm holding part and the diaphragm of the lower diaphragm holding part, the sample holding plate is provided with a thin plate-like protrusion at its one end, a lower face of the protrusion extends along a lower face of the sample holding plate, an upper face of the protrusion has a step from an upper face of the sample holding plate, the sample holding assembly is configured such that when an extracted sample, which is extracted from a base material by focused ion beam processing, is mounted in an erect state at an end face of the protrusion, the extracted sample is placed in the cell, and a flow channel formed by the groove of the lower diaphragm holding part is connected to the cell.

14. The sample holding assembly according to claim 13, wherein the first face of the lower diaphragm holding part has a first recess having a shape corresponding to an outer shape of the upper diaphragm holding part, and the first recess has a bottom face including a second recess having a shape corresponding to an outer shape of the sample holding plate, and the three components of the upper diaphragm holding part, the sample holding plate and the lower diaphragm holding part are assembled by disposing the sample holding plate in the second recess of the lower diaphragm holding part and disposing the upper diaphragm holding part in the first recess of the lower diaphragm holding part so as to cover the sample holding plate.

15. The sample holding assembly according to claim 13, further comprising a heater mounted to at least one of the upper diaphragm holding part and the lower diaphragm holding part, wherein the heater is disposed at a position corresponding to the flow channel.

16. The sample holding assembly according to claim 13, wherein
the sample holding plate includes an electrode to be connected to the sample mounted at the protrusion.

17. The sample holding assembly according to claim 13, wherein
faces of the three components that mate with each other for assembly are mirror-finished faces.

18. The sample holding assembly according to claim 13, wherein
the hole of the upper diaphragm holding part has a tapered shape so that a cross-section of the hole becomes narrower from the first face to the second face, and the diaphragm of the upper diaphragm holding part is disposed at the second face.

19. The sample holding assembly according to claim 13, wherein
the sample holding plate has a dimension in a longitudinal direction thereof of 4 to 5 mm, has a dimension in a width direction thereof of 2 to 3 mm. and has a thickness of 200 to 500 µm, and the protrusion has a thickness of a part at which the sample is to be mounted of 50 to 10 µm.

20. The sample holding assembly according to claim 13, wherein
the sample holding plate includes a ceramic or a member coated with ceramic.

* * * * *